United States Patent [19]

Reed et al.

[11] 4,169,290
[45] Sep. 25, 1979

[54] DATA RECORDING METHOD AND APPARATUS

[75] Inventors: Alan C. Reed, Salt Lake City; John H. Sherwood, Bountiful, both of Utah

[73] Assignee: Utility Services, Inc., Salt Lake City, Utah

[21] Appl. No.: 872,648

[22] Filed: Jan. 26, 1978

Related U.S. Application Data

[63] Continuation of Ser. No. 755,846, Dec. 30, 1976, abandoned, which is a continuation of Ser. No. 592,057, Jun. 30, 1975, abandoned.

[51] Int. Cl.$^2$ ............................................. G06F 3/14
[52] U.S. Cl. ............................... 364/900; 179/2 AM
[58] Field of Search ... 364/200 MS File, 900 MS File, 364/401; 360/4, 6; 179/2 AM

[56] References Cited

U.S. PATENT DOCUMENTS

| | | | |
|---|---|---|---|
| 3,416,075 | 12/1968 | Rutenberg | 346/14 MR |
| 3,820,075 | 6/1974 | Ebner | 364/200 |
| 3,823,388 | 7/1974 | Chadima | 364/4 X |
| 3,842,248 | 10/1974 | Yarnell | 364/401 |
| 3,859,635 | 1/1975 | Watson et al. | 364/200 |
| 3,956,740 | 5/1976 | Jones et al. | 360/4 |
| 4,004,097 | 1/1977 | Spaulding | 179/2 AM |
| 4,016,542 | 4/1977 | Azure | 364/900 |

*Primary Examiner*—Mark E. Nusbaum
*Attorney, Agent, or Firm*—Cushman, Darby & Cushman

[57] ABSTRACT

A method and apparatus for recording utility meter readings is disclosed. The apparatus includes a solid state memory and an input/output unit which, among other things, causes meter location and identification information to be written into memory, and data representing the respective meter readings to be read out of the memory unit into a central processing unit. A keyboard is utilized to introduce meter readings into the memory and to control the addressing of the memory as each of a plurality of meters is located, identified and the data displayed thereon entered into memory. A visual display unit displays the location of the meter to be read, the meter identification and the meter reading entered via the keyboard. A comparator circuit within the recorder compares the meter reading with expected predetermined maximum and minimum limits for the meter reading and generates an indicator signal to the display when the meter reading does not fall within the predetermined bounds. The meter is portable, is powered by batteries and is programmable to provide the location and identification of a plurality of meters as desired.

16 Claims, 16 Drawing Figures

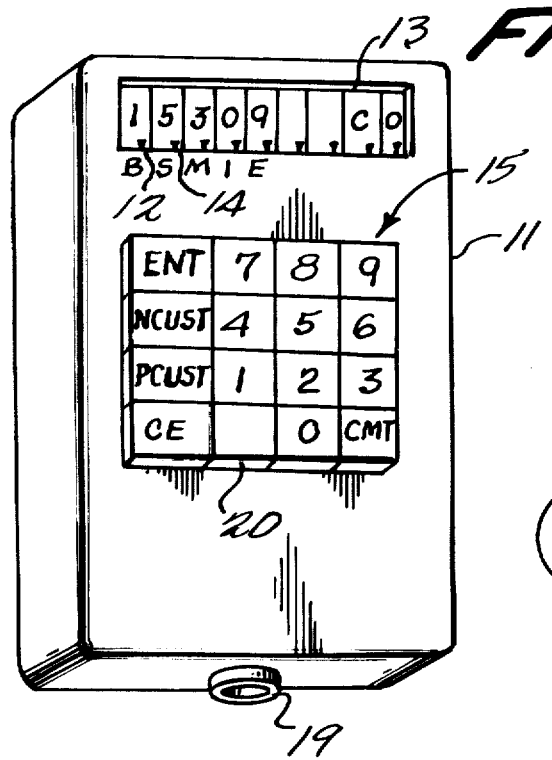
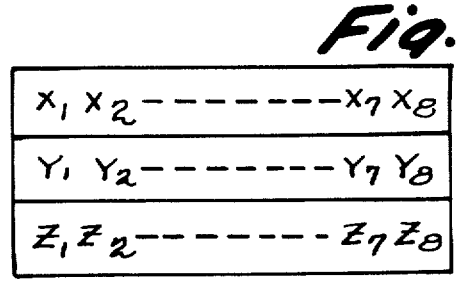
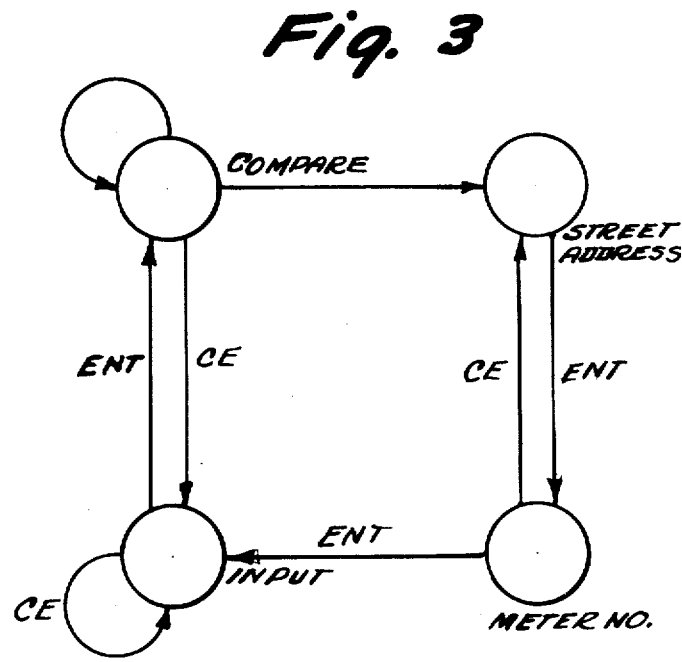
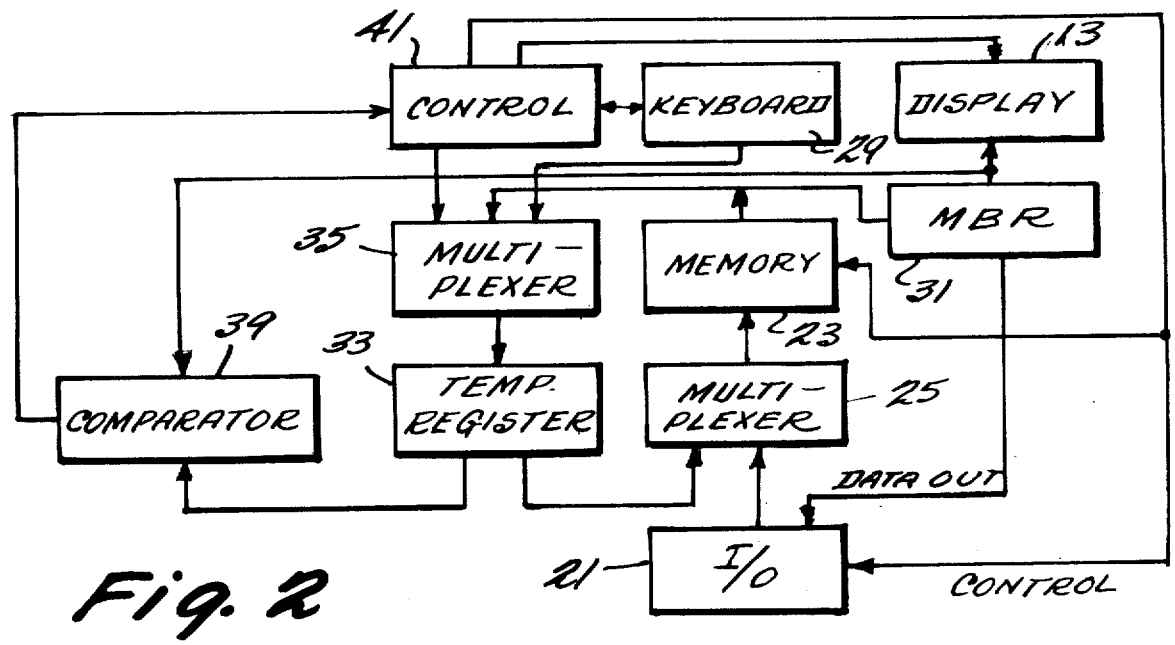

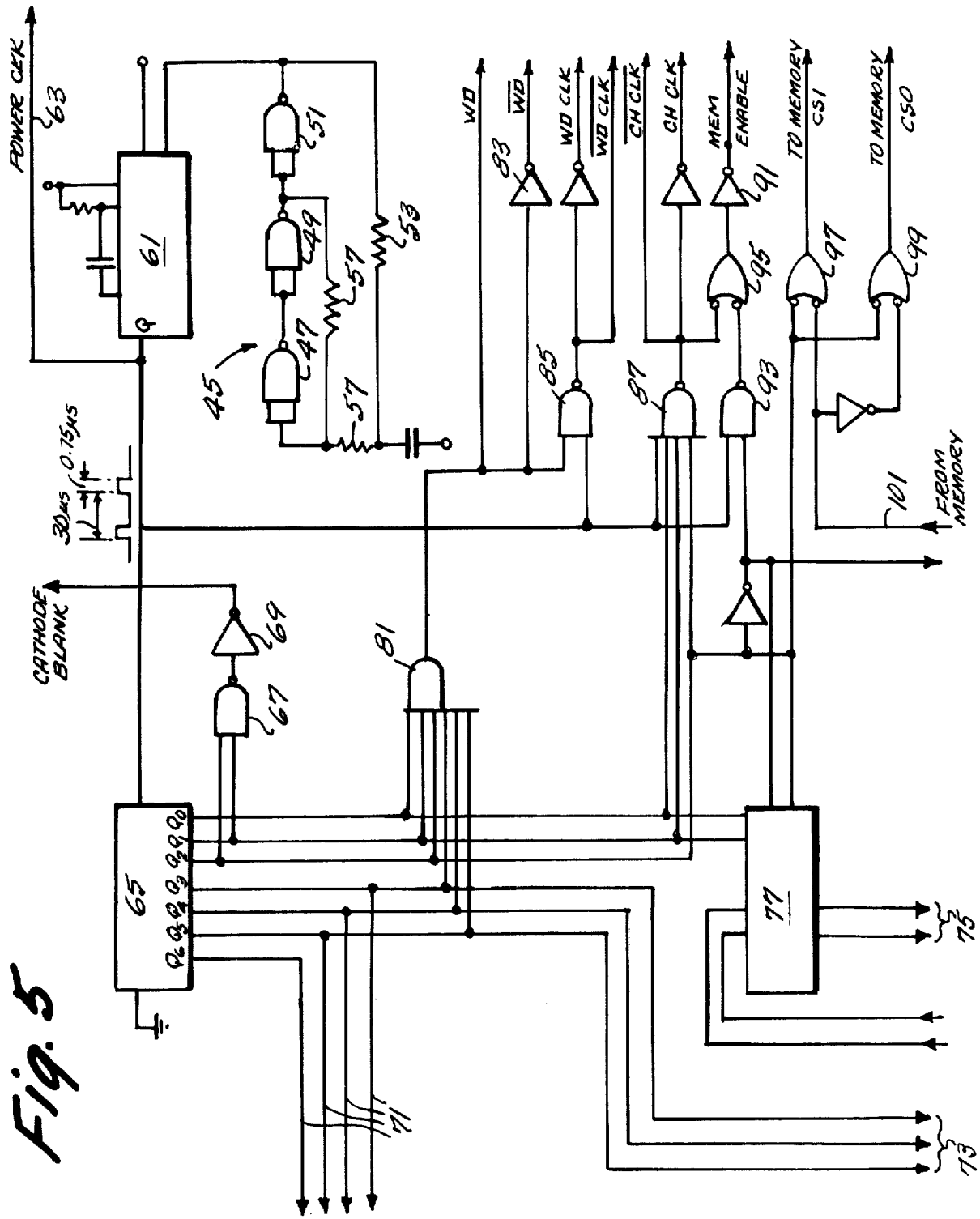

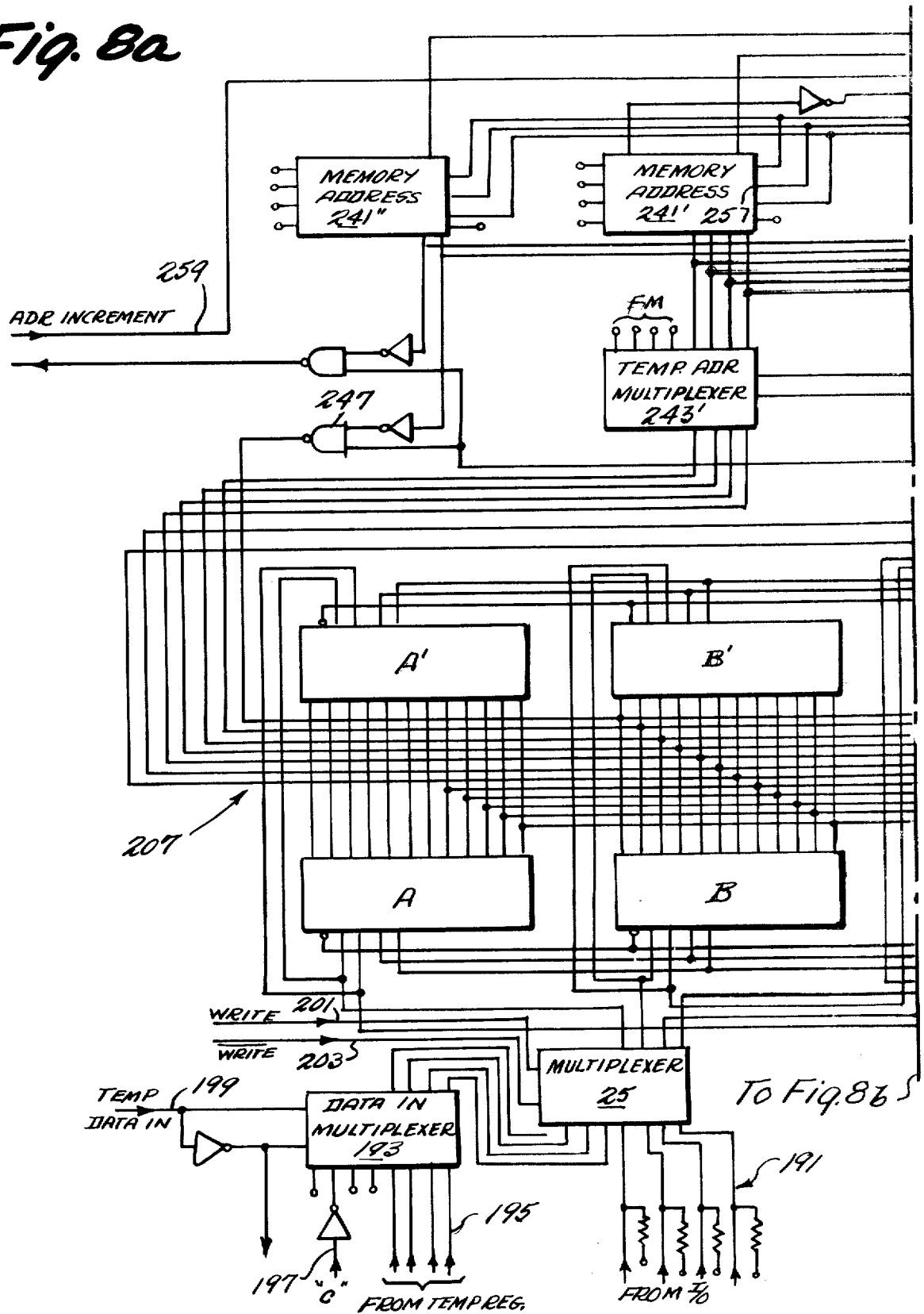

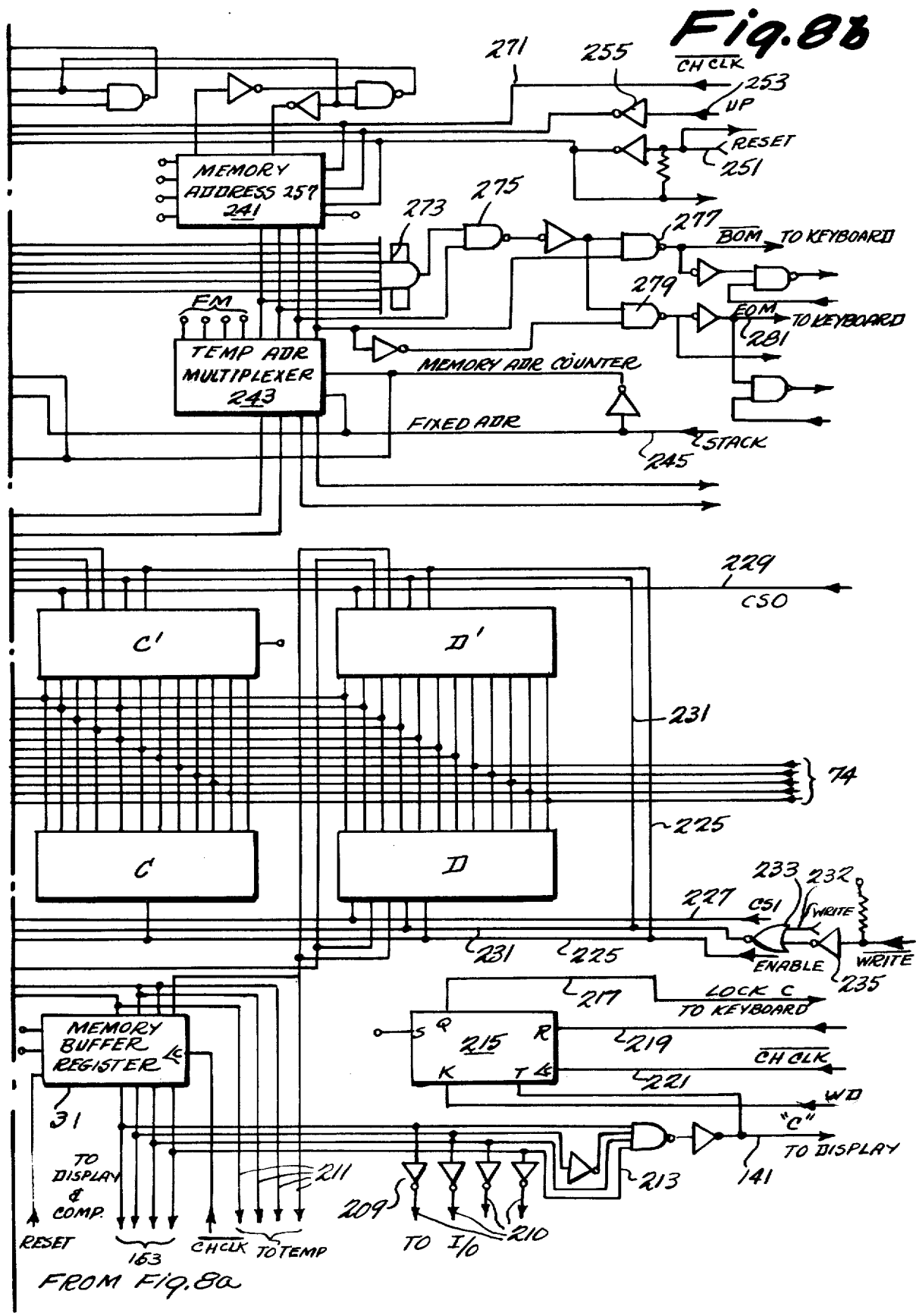

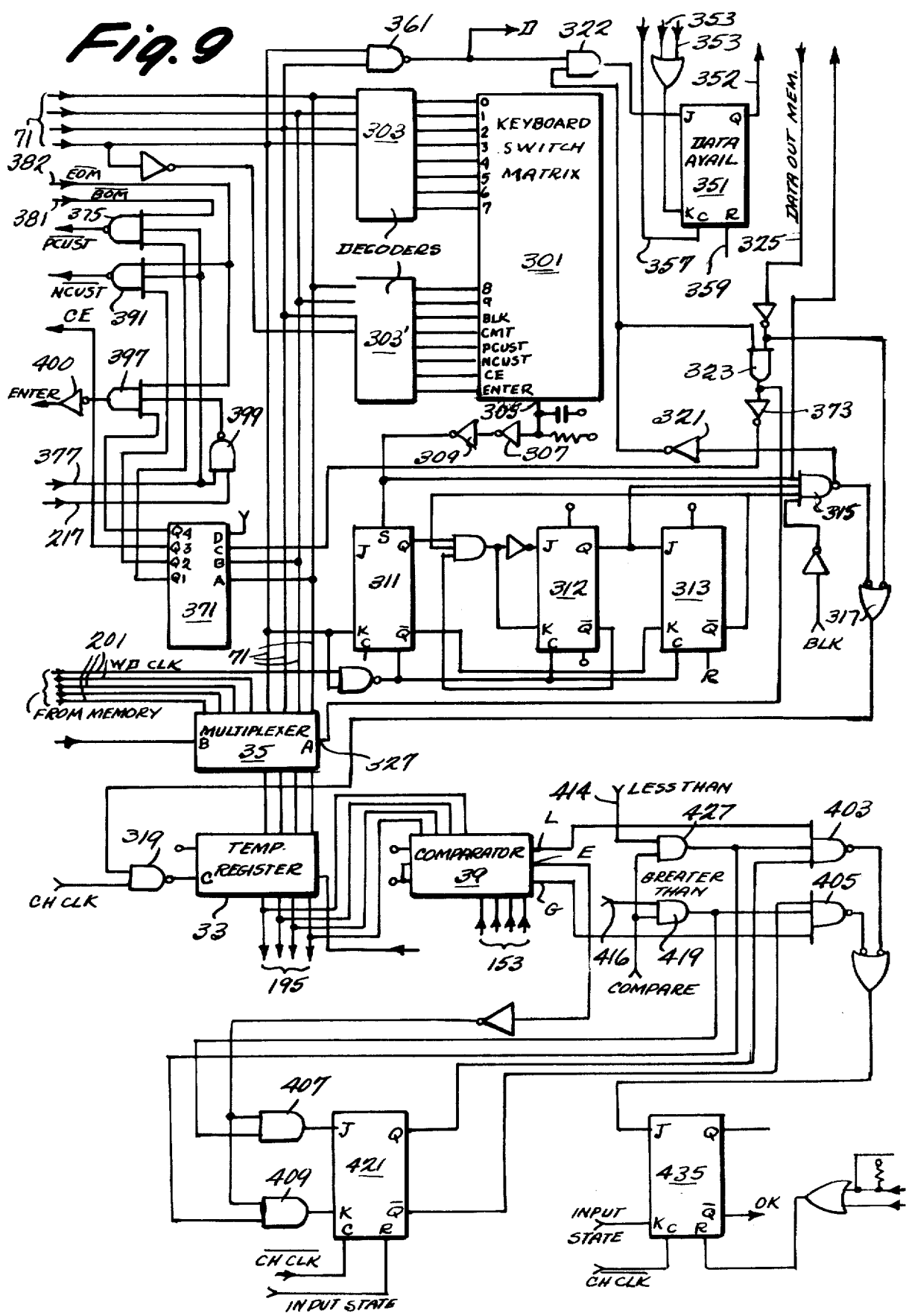

From Fig. 10a

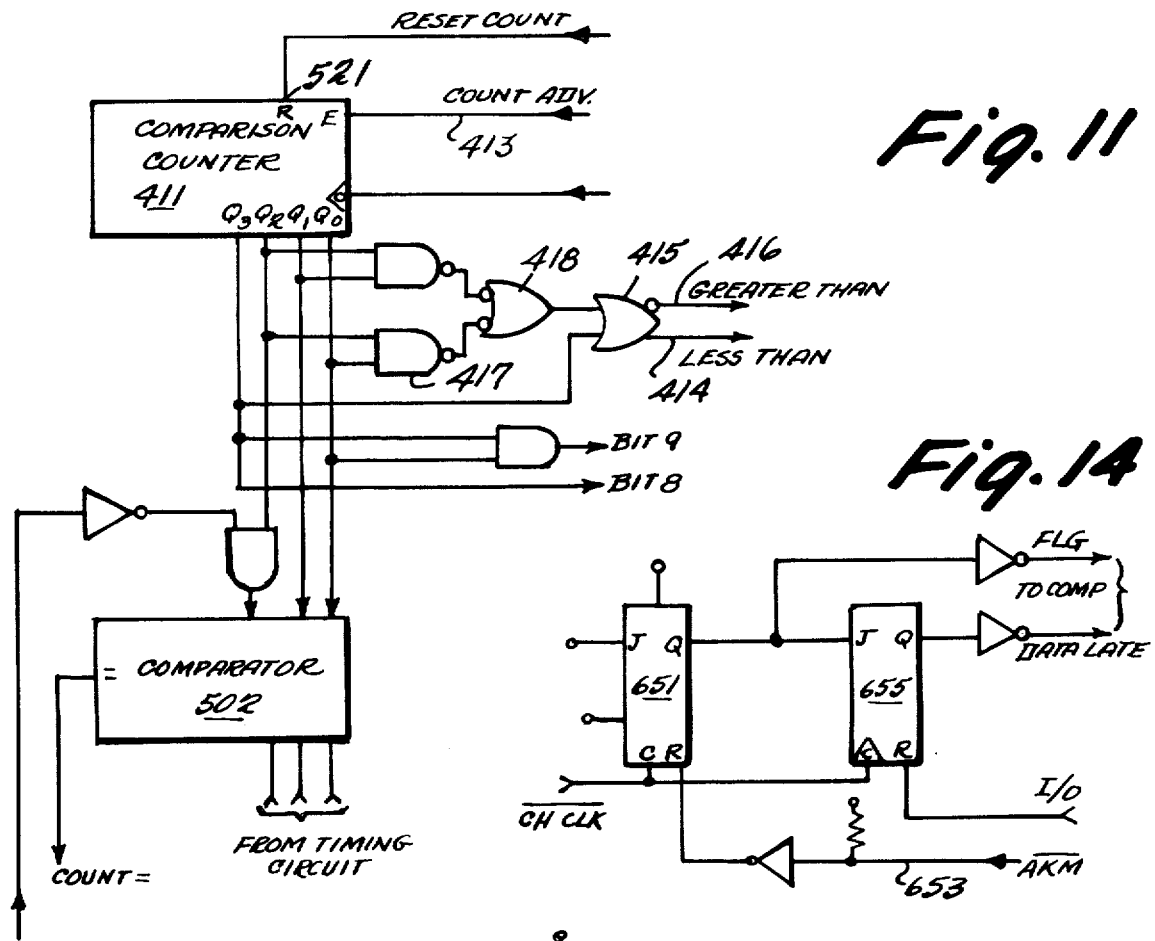
Fig. 11
Fig. 14
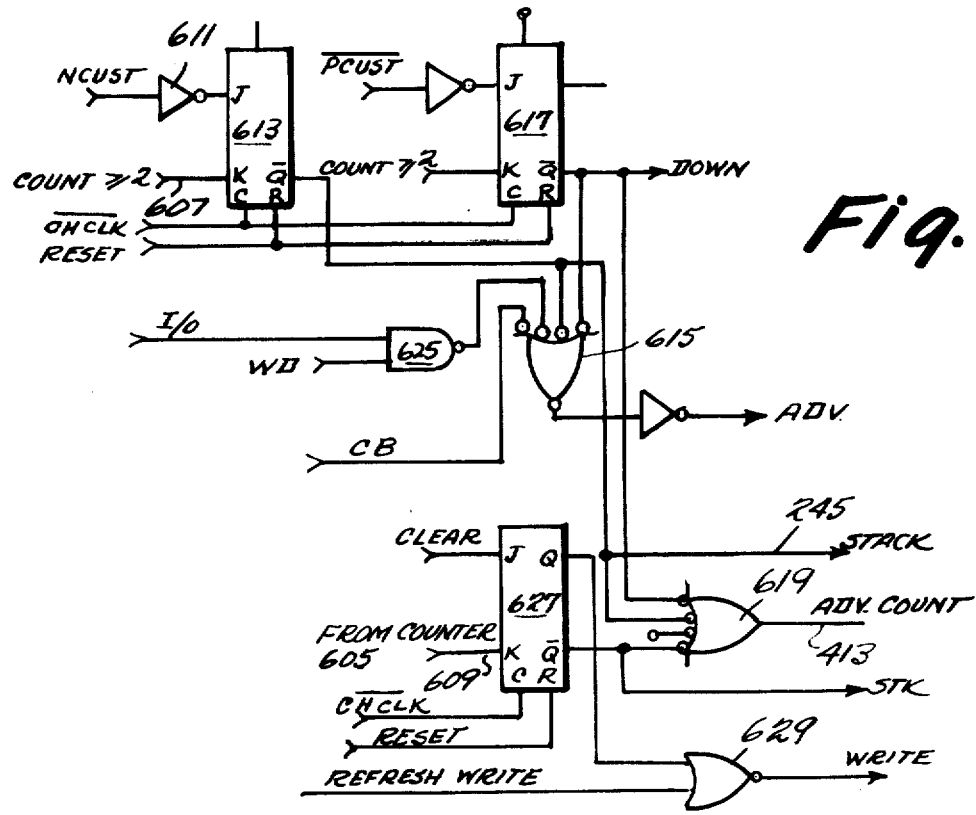
Fig. 13

DATA RECORDING METHOD AND APPARATUS

This is a continuation of Ser. No. 755,846, filed Dec. 30, 1976, now abandoned, which is a continuation of Ser. No. 592,057, filed June 30, 1975, now abandoned.

BACKGROUND OF THE INVENTION

The present invention relates to an improved method and apparatus for recording and temporarily storing the data acquired, for example, from utility meters and the like.

Typically, the various utility meters which measure the domestic consumption of gas, water and electricity at residential localities are equipped with a plurality of indicator dials. These dials usually each includes a dial pointer and an associated scale which provide on a cumulative basis an indication of the consumption of a particular commodity or energy. In utility systems utilizing such meters, it is typical to employ meter readers or inspectors who go to each of the various residences of the utility system to periodically read and record the meter readings. As is well known, such readings are subject to error which results in the utility companies being subjected to a significant volume of complaints and the associated costly process of continually effectuating numerous billing adjustments. In addition, the meter reading process is inefficient since the reader's data must be transposed at a central station to convert the readings to a form suitable to be inputted to present day electronic data processing machines. It accordingly can be seen that in the initial stages of present day utility data acquisition systems, the process of acquiring data from the utility meters is slow, inefficient, and subject to error while the latter stages of billing the individual subscribers is usually efficient and accurate because of the use of general purpose electronic data processors programmed to provide the necessary billing information based on the data acquired. It therefore can be seen that there has been developed a need for improving the efficiency in the process of acquiring meter data in order to improve the overall efficiency of the billing process. The need has become more acute in recent times because of the growing public demand for monthly readings of utility meters with a concomitant monthly billing in order to provide the subscriber with a more current information with regard to the amount of energy or commodity being used.

In the past, Miller, as disclosed in U.S. Pat. No. 2,964,374, made an early attempt to record utility meter information on computer cards so that the cards could subsequently be directly read by a computer at a central location. The apparatus of Miller was cumbersome and required that special caution be taken so that the cards did not become bent or otherwise damaged before insertion into the reading unit of the electronic data processor. Further, the Miller device did not have any error checking provisions therein to insure that the data recorded corresponded to that indicated on the meter, and to indicate whether the meter reading was within selected bounds. Accordingly, the Miller device was subject to many of the same errors and inefficiencies normally encountered when meter data was entered into a book prior to being punched into computer cards.

Subsequently, Eichacker provided a magnetic recorder as disclosed in U.S. Pat. No. 3,006,712 wherein a modified or specially designed utility meter is required. The drawback to the Eichacker development is that specially designed utility meters are required necessitating the removal and replacement of conventional utility meters presently in service. Accordingly, for practical purposes, the Eichacker development was not economically feasible because of the substantial capital investment in conventional utility meters already in service and the time and expense involved in replacing these meters with the specially designed Eichacker meters.

Davis et al disclosed in U.S. Pat. No. 3,323,132 a portable digital recorder for recording the readings on utility meters. The recorder included a keyboard having hard wired coded switches which provide energizing signals to selected parallel oriented recording heads. The Davis et al development, however, had not provision for recording meter identification and address information and in addition required a cumbersome magnetic tape recording system which necessarily limited the portability of the meter because of substantial current drainage when operating the recorder. In a subsequent development Davis et al as disclosed in U.S. Pat. No. 3,289,210 provided an improved recorder which provided hardware for coupling data from a plurality of variably settable digital switches to recording heads. The improved recorder, however, still required a magnetic tape recorder and did not have meter identification and address information stored therein for presentation to the meter reader and did not have error checking circuitry for insuring that the meter reader fell within preselected bounds.

Hood disclosed in U.S. Pat. No. 3,195,139 a data recording device for recording the output of utility meters. The recorder includes a magnetic tape memory to which is supplied data from a utility meter via a specially designed receptacle on the utility meter. Thus, when the recorder is plugged into the receptacle on the utility meter, a block of data is read into the recorder, which data includes the meter identification number as well as the rate and area code, together with the actual meter reading. However, if the Hood recorder is operated without the meter receptacle, there is no means for providing meter identification, rate and area code information for storage on the tape, and accordingly, the Hood development becomes subject to the same errors as a manual meter reading unless each of the meters in service is replaced by utility meters of a special design. As aforementioned in connection with the discussion of the Eichacker development, to replace conventional utility meters in service would result in substantial expenditures of time and money.

Subsequent to the Hood development, Chapsky developed a meter recording system as disclosed in U.S. Pat. No. 3,419,883 wherein the output of a utility meter being read is first converted so that digital signals can be developed corresponding to the meter reading. In addition, a source of binary coded data representing the serial number of the utility meter was provided as a modification of the utility meters in service. A plug associated with the recorder was inserted into a receptacle attached to the utility meter for receiving the digital information on magnetic tape. Chapsky did make a provision in his recorder for manually inputting the displayed meter data but made no provision for providing address or other identifying data except through a specially designed utility meter. Thus, Chapsky was subject to many of the same errors which have plagued the utility industries in the past. Subsequent to the original Chapsky development, he provided an improved recorder development as disclosed in U.S. Pat. No.

3,422,441. The improved recorder required a magnetic tape recording system in combination with a modified utility meter. A provision is made for manually recording of the data displayed on the utility meter, but there is no provision for displaying or recording address or other identifying data, except through a specially modified utility meter. It accordingly can be seen that there is a need in the industry for a recording device which accurately identifies the meter and the location thereof for each meter being read so that the reader can be sure that the meter data stored in the recorder relates to the proper meter. In addition, the need is evident for a recording device which does not require a system-wide modification of utility meters already in service while at the same time providing for the efficient and accurate recording of utility meter data. It is further important that a recorder be provided with internal error checking to signal the meter reader when the information inputted into the recorder is likely to be erroneous. Such a feature would not only limit the time and expense of reading utility meters but would also avoid potentially strained relations with the subscribers.

It accordingly is an object of this invention to provide an improved portable recording device for efficiently and accurately recording data.

SHORT STATEMENT OF THE INVENTION

Accordingly, this invention relates to a method and apparatus for recording data displayed on utility meters at each of a plurality of locations. The apparatus includes a portable recorder having a solid state memory of the random or sequential access type which memory stores meter location and meter identification information and in addition stores the displayed data of each utility meter read. A keyboard is provided for introducing the utility meter data into the memory and for appropriately stepping the meter to the next meter location or to the previous meter location and for stepping the recording device through each of the data input states. A display means visually displays in sequence, the location of a meter to be read, the identification of the meter to be read, and the meter data as entered into the recorder via the keyboard. An input-output unit is provided for writing location and meter identification information into the memory of the recorder so that this information is sequentially displayed to the meter reader as each of a succeeding plurality of meters is read. In addition, the input-output unit reads the stored data from memory into a central processing unit which stores and processes the data read from the utility meters. A comparator within the recorder receives binary coded data corresponding to the displayed meter reading as entered into the recorder via the keyboard and compares this value against upper and lower limits for the identified meter, which limits are preselected on the basis of a previous history of meter reading. If the meter reading keyed into the recorder falls outside the upper or lower limits, visual indication is provided by the recorder to the meter reader so that the meter reading keyed into the recorder can be checked. The upper and lower limits compared are stored in the memory unit together with the location and meter identification information with a set of upper and lower limits being unique to each of the plurality of meters being read.

In operation, the input-output unit is connected to the input-output unit of a general purpose data processing unit which writes customer location, meter identification and preselected upper and lower limits of probable commodity or energy usage for each meter into the memory. The location of the first meter is then displayed on the display of the recorder and when verified by the reader, the recorder is advanced to display the identification of the meter to be read at the location. When this is verified by the meter reader, the recorder is advanced to the input state wherein the data displayed on the utility meter is introduced into the recorder via the keyboard. This data is displayed and verified visually by the meter reader. At the same time a comparison is automatically made to insure that the entered reading is within the preset upper and lower limits of probable commodity or energy usage. If the inputted data is within the preset limits, the data is stored in memory and the locality of the next meter is displayed. If the comparison fails the data can be re-entered into the meter and a second comparison made or the meter reader can override the comparison and have the recorded data entered into memory. The failure of a comparison is visually indicated by flashing commas on each of the individual digit display sections of the display unit. After each of the meters initially stored in memory has been appropriately read and the data therefrom entered into the recorder, the input-output unit of the recorder is coupled to the input-output of the central processing unit and the data stored in the recorder is read out of memory and written into a central processing unit.

BRIEF DESCRIPTION OF THE DRAWINGS

Other objects, features and advantages of the present invention will become more fully apparent from the following detailed description of the preferred embodiment, the appended claims and the accompanying drawings in which FIG. 1 is an illustration of the recorder of the present invention shown in perspective;

FIG. 2 is a block diagram of the preferred embodiment of the recorder of the present invention;

FIG. 3 is a functional diagram of the major states through which the recorder of the present invention sequences;

FIG. 4 is a schematic illustration of a typical memory location;

FIG. 5 is a schematic block diagram of the timing generator of the preferred embodiment of the present invention;

FIGS. 8a and 8b are a block diagram of the memory unit of the preferred embodiment of the present invention;

FIG. 9 is a block diagram of the keyboard of the preferred embodiment of the present invention;

FIG. 11 is a schematic illustration of circuitry for controlling the comparison of input data with preset upper and lower limits;

FIG. 13 is a schematic illustration of the circuitry for controlling the timing of the addressing of the next or previous location; and FIG. 14 is a schematic block diagram of a circuit for regulating the flow of data between the recorder of the present invention and a central processing unit.

DETAILED DESCRIPTION OF THE PREFERRED EMBODIMENT

Figure 6:
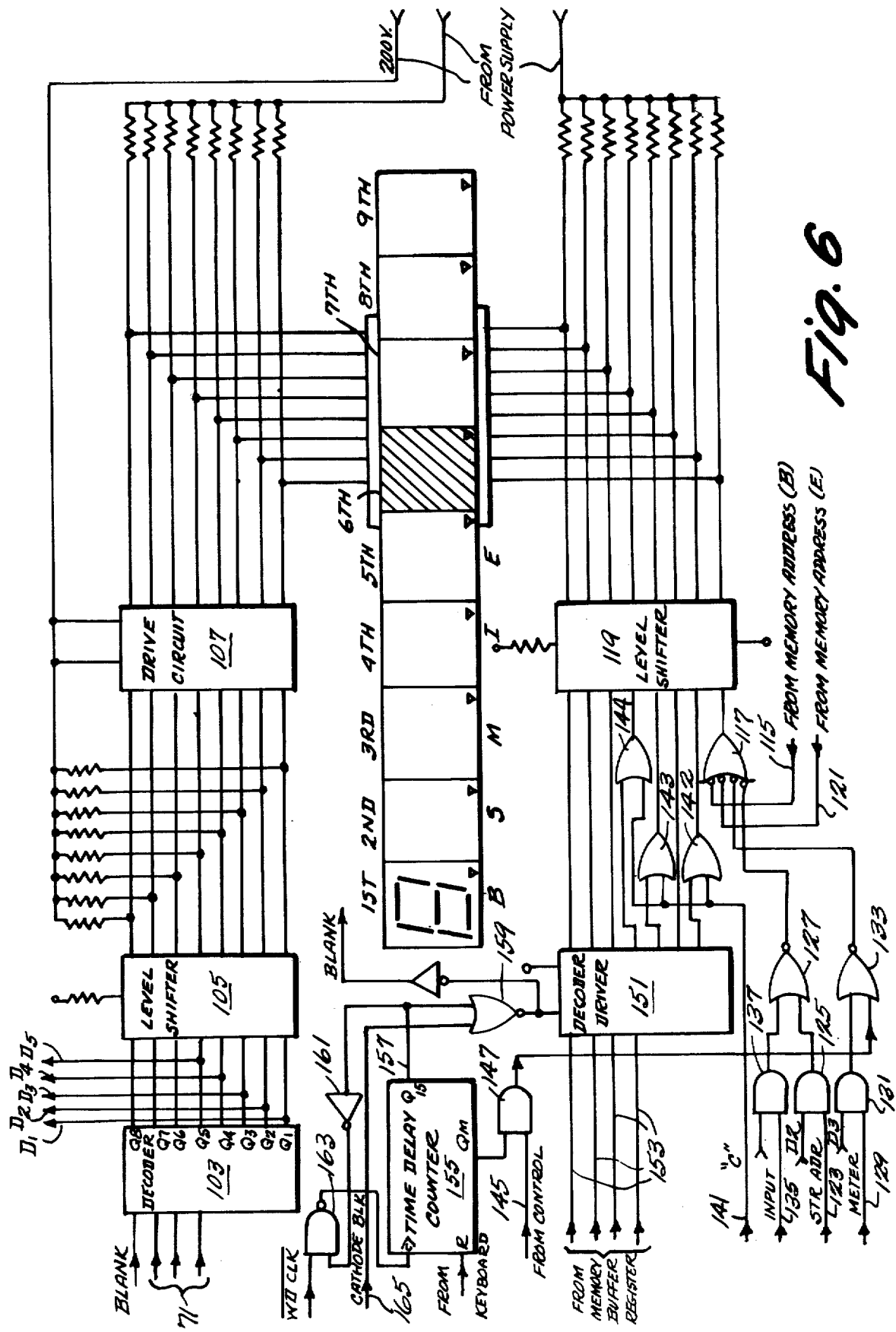
FIG. 6 is a schematic illustration of the display of the preferred embodiment of the present invention.

Refer now to FIG. 1 where there is illustrated in a perspective view the recorder of the present invention. The recorder 11 is a hand-held, keyboard actuated display unit which displays customer or meter location information such as in the form of a five-digit house number and a three-digit street code. Next in sequence, up to an eight digit combination of a meter location code and a meter serial number is displayed. The meter location code will indicate, for example, where on the premises the meter is located, such as behind the house or in the basement, and the meter serial number uniquely identifies the meter or meters at the particular locality. The particular display 13 utilized may be of any conventional design known in the art. In the preferred embodiment a plasma display designated Panaplex II produced by the Burroughs Corporation is utilized but it should be understood that any appropriate display such as, for example, a light emitting diode display of conventional design could be utilized.

A keyboard 15 is utilized for entering utility meter readings and special codes during the input state of the recorder to indicate conditions of the utility meter which may require maintenance, inspection or other appropriate attention. Thus, for example, if the meter appears to be broken or tampered with, a special code such as 01 may be entered indicating the condition of the utility meter. In addition, other codes may be entered designating hazardous conditions such as the presence of dogs, etc. In addition to entering numerical information, the keyboard includes an ENTER key designated ENT which causes data to be entered into memory and in addition, causes advance of the recorder through its major functional states illustrated schematically in FIG. 3.

A next customer key NCUST is provided for advancing the memory address to the next customer location for display of the location information relating thereto on the display panel 13. A previous customer key PCUST is provided for returning the memory address to the previous customer location if desired. A clear key CE is provided for returning the recorder to the previous functional state, i.e., the street address state from the meter number state, and clears a temporary memory register if an error is discovered by the meter reader during keying of the meter reading in the input state so that the reading can be re-keyed into the recorder. A comment key CMT is provided for entering special codes to indicate conditions requiring maintenance or inspection of the utility meter and is used or functional only during the input state of the recorder. The keyboard 15 is preferably waterproof as is the housing 11 so that the utility recorder can be used during inclement weather while at the same time being substantially resistant to shocks caused by dropping the recorder.

Each unit includes an interface 19 for transferring data with respect to a central processing unit. The interface is connected to the central processing unit by a suitable receptacle and causes the data in the computer and in the recorder to be transferred with respect to one another.

Refer now to FIG. 2 which is a block diagram of the recorder of the preferred embodiment of the present invention. In the preferred embodiment a parallel input-output unit 21 is provided. The input-output unit has eight data lines and eight instruction signal lines for communication between the recorder and a central processing unit. As an example, the input-output unit 21 can be a standard RS-232 interface. It should be understood, however, that a serial interface may be utilized in lieu of a parallel interface in order to provide access with respect to the recorder's memory unit 23 via a standard RS-232 type serial data interface which may be used in conjunction with either a BELL 103 or 202 type modem for remote data communication. As will be more fully discussed hereinbelow, signals for controlling the recorder are coupled from a computer through the input-output unit 21 to a memory unit 23 via a multiplexer 25. Four bit binary coded characters are inputted to the memory unit via the multiplexer with eight characters making up each word of a customer record. The information inputted to the memory unit prior to utilizing the recorder in the field includes the customer address, meter serial numbers and special information codes such as the location of the meters at each address and such particularized information as fact of a dangerous dog nearby, etc. In addition, as an error check, predicted upper and lower extremes of each meter reading are stored in memory based on the previous history of customer or subscriber usage. The memory unit 23 is preferably of the solid-state type such as an appropriate combination of Motorola 4096 bit memory units. It should be understood that either solid-state sequential access memory units or random access memory units may be utilized as desired. Sequential access memory units require less programming and since meter identification numbers and addresses are sequentially read into memory and accessed during operation of the recorder, sequential access memory units, although not as versatile as random access memory units, may be advantageously used in the present invention. After the memory has been preprogrammed, i.e., loaded with customer addresses, meter serial numbers, and other information, the input-output unit is disconnected from the central processing unit and the recorder is ready for utilization in the field.

Refer now to FIG. 4 which is a schematic illustration of a typical customer memory location wherein each location includes three, eight character words. The first word represented by the characters $X_1-X_8$ contains the street address preferably in the following form:

$X_1-X_5$ = the house number, and
$X_6-X_8$ = the street code.

A character "c" will be entered into the $X_8$ character location when a particular subscriber location, designated by the characters $X_1-X_7$ has been entered, as will be explained more fully hereinbelow. The second word, represented by the characters $Y_1-Y_8$ contains the meter serial number and comments to the meter reader. The comments may include a two-digit, i.e., two character, code indicating special circumstances regarding the meter identified, such as the location of the meter on the premises and any other circumstances such as, the known presence of a dangerous animal in the vicinity. In the third word, the characters $Z_1-Z_4$ initially contain the upper limit of the expected meter reading and $Z_5-Z_8$ initially contain the expected lower limit of the meter reading. After the meter has been read and the data entered into memory, via the keyboard, the characters $Z_1-Z_8$ will contain the meter reading and, in a two-digit code, any comments about the meter read. The comments may include codes representing a defective meter or a meter that has been tampered with.

Refer now back to FIG. 2. At the outset, once a particular route is to be initiated, the meter reader may activate the display by depressing the BLANK key 20. The BLANK key's only function is to activate the meter display 13 which, as aforementioned, is a conventional alpha-numeric illuminated display. When the display is activated, information with respect to the route, such as the route number and date, is initially displayed. In the alternative, the recorder can be programmed to begin with the street address of the first customer or subscriber, if desired. After the BLANK key 20 is pushed, the comma labeled B in the first digit location of the display 13 is energized to indicate that the beginning of memory is being accessed. If the route information has been displayed, the NCUST key is depressed which causes the memory location of the street address of the first customer to be accessed and coupled to the display 13 via memory buffer register 31. If route location information is not initially inputted to the memory, upon pushing the BLANK key 20, the street address of the first customer is directly accessed without requiring depression of the NCUST button. The street address information is also coupled to a temporary memory register 33 via a multiplexer 35. During the time in which the street number is being displayed, the comma labeled S of the second digit position of the display is energized to indicate that the meter is in the street address state. When the ENTER (ENT) key is depressed the lock character "c" is written into the character position $X_8$ as aforementioned. The "c" is removed if the CE key is pressed to return to the street address state. The "c" will be displayed on the rightmost or ninth digit display position of the display 13 if a meter reading is entered the recorder is returned to the street address state by pressing the PCUST key.

Once the street address has been verified, the recorder may be stepped to the meter number state by depressing the ENTER key. Alternatively, the meter reader can step forward or backward through the memory unit 23 as far as desired by using the previous customer key, i.e., PCUST, or the next customer key, i.e., NCUST. When the beginning of the memory is being accessed, the previous customer key PCUST is disabled. When, on the other hand, the recorder is at the end of the memory, the next customer key NCUST is disabled. As aforementioned, when the beginning of memory is being accessed, the comma labeled B is energized and when the end of memory is being accessed, the comma labeled E is energized.

After the street address has been verified, the recorder enters the meter number state whererin the meter number comma labeled M at the third digit location on the display is energized and the meter serial number to be read is displayed in the first through fifth digit positions. In addition, the seventh through ninth digit positions may display a coded comment to the meter reader such as the location of the meter. The meter number is accessed from memory 23 and coupled to the display 27 via the memory buffer register 31. In addition, this information is coupled to the temporary register 33 via multiplexer 35. When the meter number has been verified, the meter reader can step to the input state by depressing the ENTER key. If there should be some discrepancy in the meter identification number and the reader wishes to go back to the street address and start over again, he may do so by depressing the clear key CE.

After the meter identification number has been appropriately verified and the ENTER key depressed, the recorder advances to the input state. The input comma labeled I in the third digit is energized and the display will go blank. The meter reading is now entered using the numeric keys of the keyboard, and if desired, a comment can be entered by depressing the comment key CMT which enters a "c" in the next digit position. The comment in coded form is then displayed in the eighth and ninth digit positions by properly keying selected numeric keys. The information entered into the keyboard unit 29 by depressing the appropriate keys is coupled to the multiplexer 35 and then stored in a temporary memory word via the temporary register 33. The meter reading stored in temporary register 33 is then coupled to comparator 39 to which is also sequentially coupled the stored expected upper and lower limits of the meter reading. If the reading keyed into the recorder falls within the predetermined expected upper and lower units, a signal is coupled to control unit 41 which causes the meter reading to be stored in the memory unit 23 via the multiplexer 25. When this occurs, the recorder automatically steps to the street address state and displays the street address of the next customer. If the limit check comparison fails, the meter reading continues to be displayed and each of the comma indicators flash on and off to indicate the possibility of an error condition. After a recheck has been made, the meter reader may force the entry of the reading in memory by depressing the ENTER key or in the alternative, clear the entry by depressing the CE key and again trying to enter the meter reading. The meter reading is stored in the memory unit 23 in the memory location $Z_1$-$Z_8$ by destroying the limits previously stored therein.

The control unit 41 includes circuitry for advancing the memory location accessed forward and backwards, for accepting data therein and for storing data inputted into the recorder via keyboard 29. In addition, the control unit controls operation of the display, the multiplexer 25, multiplexer 35 and the input-output unit 21. A more detailed description of each of the elements illustrated in FIG. 2 is set out hereinbelow.

Refer now to FIG. 3 which is a functional illustration of the major states through which the recorder of the present invention steps as each meter is addressed and read. In the initial state, i.e., the street address state, the street address of a customer is displayed on the display 13. During the street address state, the PCUST key can be depressed to step the memory back to the previous customer except when the beginning of memory indicator B in the first digit position is energized. In addition, the next customer key can be depressed except when the end of memory indicator E in the fifth digit position is energized. Finally, the enter key may be depressed for validating the street address and to advance the recorder to the meter number state at which time the signal "c" is in the last digit position of the address word. As aforementioned, the signal "c" is indicative of the fact that the recorder has stepped to the next state, namely, the meter number state. In the meter number state, the identification number of the meter is displayed. In the meter number state the ENTER button can be depressed to advance the recorder to the input state and in addition, the clear key CE can be depressed to return the recorder to the street address state wherein the previous street address displayed is again displayed on the display unit 13. When the CE key is depressed to return the recorder to the street address state, the "c" character in the address word is replaced by a blank, thereby indicating that the meter reading has not been entered. The purpose for providing the return to the previous street address is in case the meter number does not appear to match with the meter located at the previously displayed street address. When the recorder is returned to the street address state, the meter reader can again verify that the meter is at the correct location.

If the ENTER key is depressed, the recorder steps to the input state wherein the meter reading is introduced into the recorder via the keyboard unit 29 by depressing the appropriate ones of the keys 0–9. If desired, a comment code may be entered by depressing the CMT switch and then entering a code number corresponding to the comments desired to be entered into memory.

If the meter reading number entered and displayed on display unit 13 does not correspond to that appearing on the meter through a mistake on the part of the meter reader, the temporary memory location can be cleared, thereby clearing the display by depressing the CLEAR key. When this occurs, the recorder can again enter the meter display by depressing selected ones of the keys 0–9. When the correct meter reading is displayed on display unit 13, the ENTER button is depressed and the recorder advances to the fourth state, that is, the compare state. In the compare state the meter reading entered into the recorder is compared against upper and lower limits initially introduced into the memory unit 23 with regard to each meter. If the input is within the predetermined limits the input data is stored in memory unit 23 and the recorder advances to the next customer, that is, the next street address. If the input data does not fall within the predetermined limits, the comma indicators in each of the digit positions flash to indicate that the meter readings should be again checked. At this point, the meter reader has the option to depress the CLEAR button so that the recorder can be returned to the input state and the meter reading can be again introduced to the recorder by appropriately depressing appropriate keys 0–9. If on the other hand, the meter reader finds that the meter reading data entered into the recorder is correct as viewed from the utility meter, the meter reader can depress the ENTER key, in which case the false comparison is overridden, the data introduced to the recorder stored in memory unit 23, and the recorder advanced to the street address state for the next customer. The latter eventuality may occur, when for example, the customer has used more or less energy or more or less of a commodity than initially anticipated by the utility, and accordingly, the data entered into the recorder via the keyboard is correct, although it exceeds the anticipated upper limits or fall below the anticipated lower limit of energy or commodity usage as initially stored in the memory unit 23.

Refer now to FIG. 5 which is a schematic block diagram of the timing circuit of the present invention. The timing circuit illustrated in FIG. 5 is a part of the control circuit 41 illustrated in FIG. 2 and provides timing signals for the display unit, the keyboard and each of the other units of the recorder system. A clock oscillator unit generally designated by the numeral 45 includes three NAND gates 47, 49 and 51 connected in a known feedback arrangement by means of resistors 53, 57 and 59. The output of the clock oscillator is coupled to a monostable multivibrator 61, the output of which is a clock-pulse signal having a period of 30 microseconds with each pulse having a duration of 0.75 microseconds. This clock-pulse signal train is coupled to a power supply for the display unit 13 via line 63. In addition, this clock-pulse signal is coupled to a counter circuit 65 of conventional design. The sixth out of every eight pulses occurs at the output of monostable multivibrator 61. NAND gate 67 provides a low output which is inverted by circuit 69 to provide a pulse to the cathode blank input of the display unit 13. At the same time the counter circuit provides four outputs on lines generally designated by the numeral 71 which outputs provide timing signals for the multiplexed display unit 13 and for timing the keyboard unit 29. Since the memory unit 23 includes a solid state active memory, the output generally designated by the numerals 73 and 75 periodically refresh the memory unit. The output on line 75 is derived from a multiplexer 77 from the counter 65 or may be derived from the temporary memory address register of the memory unit 23.

An AND gate 81 provides an output signal which goes high during the last character of an eight character word. The output of the AND gate 81 is designated by the word signal WD. This signal is coupled to the central processing unit via the input-output unit 21 and as will be seen from the description hereinbelow, this signal is used to synchronize the resetting of the memory address counter of the memory unit 23 with the CPU before beginning a read or write of the recorder memory. The output of AND gate 81 is also inverted by inverter 83 to provide the signal $\overline{WD}$. The output of monostable multivibrator 61 having a duration of 0.75 microseconds every thirty microseconds is coupled to one input of a NAND gate 85 while the output of AND gate 81 is coupled to the other input thereof. The NAND gate 85 provides in response thereto a low output once each eight character word. This output is inverted to provide a high going pulse once each eight character word, which pulse is utilized to enable a clocking pulse to the timing counter of the display unit 13. In addition to the word-clock, a character clock pulse having a duration of 0.75 microseconds is generated every 240 microseconds or once each character at the output of NAND gate 87. This signal is inverted and provides character clock timing for each of the elements of the recorder of the preferred embodiment of the present invention.

A memory enable signal is provided at the output of inverter 91 for enabling operation of the memory unit 23 illustrated in FIG. 2. The memory enable signal is derived from one output of NAND gate 87 and from the output of a second NAND gate 93 which outputs are coupled to a NAND gate 95, the output of which is coupled to the inverter 91.

Because in the preferred embodiment the memory circuit is comprised of groups of 4096 bit memory units combined together to form a storage for each of the four bit characters, signals have to be provided for indicating which half of the memory is being read. Accordingly, a signal having a 240 microsecond duration and a 480 microsecond cycle is coupled to NAND gates 97 and 99, respectively. The signal at the output of OR gate 97 is utilized to drive or enable the reading of one-half of the memory while the output of NAND gate 99 permits reading of the other half of the memory. In addition, when the memory address counter is advancing or accessing the respective halves of the memory unit, an output is provided from the memory unit to input line 101 to indicate which half of the memory is being presently accessed. This signal is coupled to the NAND gate 97 and is inverted and coupled to the NAND gate 97 for synchronizing the reading of the respective halves of the memory unit in accordance with the particular memory location being accessed.

Refer now to FIG. 6 which is a schematic block diagram of the display unit 13 of the present invention. As illustrated, a nine digit position Panaplex display commercially available, for example, from the Burroughs Corporation, is utilized with one of the digit positions, that is, the sixth digit place being unenergized. The Panaplex display is a multiplexed device wherein each of the digit locations is successively scanned repeatedly so that the signal being displayed is continuously coupled to the display unit. The timing signals from input lines 71 provide in binary decimal code form signals for addressing each of the eight energized digit positions of the display. These timing signals are coupled to a decoder 103 which sequentially provides outputs on lines Q1-Q8. These signals are coupled to a level shifter 105 of conventional design. The level shifter raises the level of the digit address signals with the output thereof being coupled to a Panaplex drive circuit 107. The drive circuit increases the power of each digit address signal and couples the signals to the respective digit locations. As each digit location is energized, control signals are coupled to each of the digit locations to visually display predetermined characters therein. To this end at the beginning of the memory when the first street address is being accessed, a signal from the memory address register in the memory unit 23 is coupled to input 115 of NAND gate 117. The output of the OR gate 117 is coupled to a level shifter circuit 119 of conventional design known in the art with the output thereof coupled to the Panaplex display in order to energize the comma character B in the first digit position. When the end of memory is reached, a signal is provided by the address register in the memory unit 23 to input line 121, which signal is coupled to NAND gate 117, the output of which is coupled to the decoder circuit 119. The output of the decoder circuit energizes the comma character E in the fifth digit position to indicate that the end of memory has been reached.

When the recorder is in the street address state, a signal is provided from the control unit 41 illustrated in FIG. 2 to input line 123 which input is coupled to one input terminal of AND gate 125. The other input to AND gate 125 is an enabling signal derived from the D2 line at the output of decoder 103. A signal on this line indicates that the second digit position is being addressed and accordingly the output of AND gate 125, when coupled to NAND gate 117 via NOR gate 127, provides an energization signal for energizing the comma character S in the second digit position. When the recorder advances to the meter state, a signal is coupled to input line 129 which signal is coupled to AND gate 131. Another signal derived from output line D3 of decoder 103 is coupled to the other input terminal of AND gate 131. This signal enables the AND gate 131 which provides an output to NOR gate 133. The output of NOR gate 133 is coupled to NAND gate 117 and then to level shifter 119 which in turn provides an output for energizing the comma character M in the third digit position. The energized comma character M indicates to the meter reader that the recorder is in the meter identification state. When the recorder advances to the input state, a signal appears on line 135 which signal is coupled to AND gate 137. Another enabling input is coupled to AND gate 137 from the D4 output line of decoder 103. The output of AND gate 137 is coupled via NOR gate 127 and NAND gate 117 to the level shifter 119. The output of the decoder 119 energizes the comma character I in the fourth digit position.

If it is desired to enter a "c" character into memory and to display such on the display board to indicate that the street address information has been locked into memory, that a comment is associated with the meter identification number or that a comment is written into memory when the meter is read, a signal appears on line 141 which signal is coupled to a logic array including OR gates 142-144. These signals are coupled to appropriate input lines of the level shifter 119 which appropriately causes a "c" to be displayed. Finally, when a comparison is made and the inputted data exceeds or falls below the limits initially entered into memory for each meter to be read, a signal appears on input line 145 from the control unit 41 and is coupled to one input terminal of AND gate 147. The other input to AND gate 147 is derived from the timing clock generator which provides an enabling output to AND gate 147 at a rate of, for example, 1 Hz. The output of the AND gate 147 is coupled to NOR gate 133 and then to the level shifter 119 via NAND gate 117. The output of the level shifter 119 energizes all of the comma characters on an intermittent basis to cause each of the comma characters to flash to indicate that the comparison has failed.

In addition to the aforementioned inputs to the display unit a seven segment decoder driver 151 of conventional design is provided to which the output of the memory buffer register 31 is coupled via input lines generally designated by the numeral 153. The decoder circuit provides signals on the output lines thereof which are coupled to the level shifter circuit 119. The output of the level shifter 119 appropriately drives each of the digit units so that each of these units display the desired alpha numeric characters. The decoder driver 151 is appropriately controlled so that the display lasts only for a predetermined period of time which in the preferred embodiment is sixteen seconds. The reason for this is to conserve battery power during the use of the recorder in the field. To achieve such a control of the display, an input from the keyboard unit 29 illustrated in FIG. 2 is coupled to a 14 bit counter 155 which at the end of sixteen seconds provides an output at terminal 157. This output is coupled to NOR gate 159 and at the same time is inverted by inverter 161 and coupled back to one input of NAND gate 163. The other input to the NAND gate 163 is derived from the $\overline{WDCLK}$ output timing ciruict which provides a low-going pulse at the end of each eight character word. The output of the NAND gate 163 is fed back to the clock input of the counter 155 which terminates a count at the end of a sixteen second interval. In the meantime, the cathode blank output signal from the timing circuit of FIG. 5 at the output of the inverter 69 is coupled to input line 165 which is connected to the other input of NOR gate 159. Each time a cathode blank signal is generated, the display on the display unit 13 is deenergized. When a pulse at the output terminal 157 appears at the input to NOR gate 159, the display unit 13 is deenergized and the decoder driver unit 151 inhibited.

Figure 7:
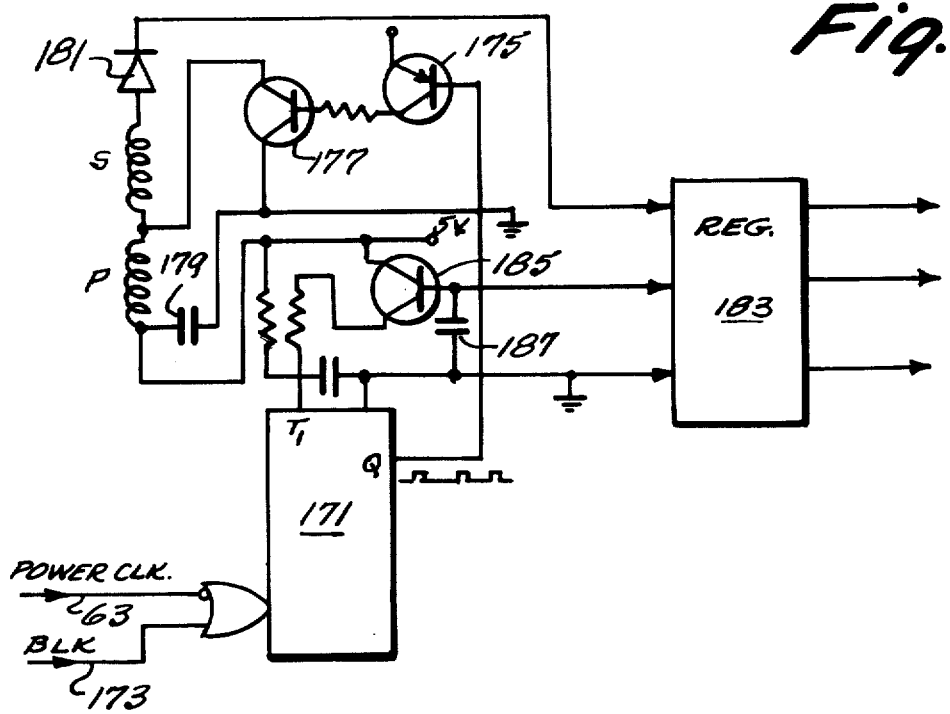
FIG. 7 is a preferred embodiment of the power source for the display of FIG. 6.

Refer now to FIG. 7 which is a schematic illustration of the power circuit for driving the display illustrated in FIG. 6. Coupled to one input of a monostable multivibrator 171 is a blanking signal on line 173. This signal is derived form the display circuit illustrated in FIG. 6 and inhibits any operation of the monostable multivibrator 171 during a blanking interval. Also coupled to the input of monostable multivibrator 171 is a power clock signal on line 63 from the timing circuit of FIG. 5, which signal is inverted before being coupled to the monostable multivibrator 171. The output at terminal Q of the monostable multivibrator has the same frequency as the power clock input signal on line 63 and is coupled to a first PNP transistor 175. The output of transistor 175 is connected to a driver transistor 177 which is connected across the serial arrangement of the primary winding P of a transformer and a capacitor 179. The transistor 177 causes the primary P and capacitor 179 to be periodically shorted to one another to thereby induce a current in the secondary winding S of the transformer. The current generated in secondary winding S is coupled via half-wave rectifier diode 181 to a voltage regulator circuit 183 of conventional design. At the same time, power flow from the regulator is detected and fed back to the input of transistor 185 past noise elimination capacitor 187. The output of transistor 185 controls the input to timing terminal T₁ of the monostable multivibrator 171 such that when additional power is being drained from the regulator 183, the duty cycle at the output Q of monostable multivibrator 171 is increased to thereby increase the power flow to the regulator 183. On the other hand, when less power is being drained by the display units, the feedback to the transistor 185 is appropriately varied to reduce the duty cycle of the signal at the output terminal Q of the monostable multivibrator 171. Accordingly, the level to which capacitor 179 charges and accordingly, the current level generated in secondary winding S is correspondingly reduced. The aforementioned variable power supply circuitry is for the purpose of controlling and limiting the use of power in the display unit, which unit requires a substantial power drain during use of the recording device in the field.

Refer now to FIG. 8a and FIG. 8b which is a schematic illustration of the memory unit 23 of the preferred embodiment of the present invention. The memory unit includes a multiplexer 25 of conventional design known in the art to which data is inputted from a central processing unit via input-output unit 21. Data is coupled to the multiplexer via lines 191. In addition, data is coupled to the multiplexer unit from the temporary register 33 via data in multiplexer 193. The data is coupled from the temporary register 33 via lines generally designated by the numeral 195. In addition, the character "c" is enabled into memory via the multiplexer unit 25 and the data in multiplexer 193 when a signal appears from the control unit 41 on line 199. Multiplexer 193 is appropriately controlled to provide data from the temporary storage register 33 or the character "c" enabling signal to the multiplexer 25 by a signal on the multiplexer control line 199 derived from the control unit 41 of the present invention. At the same time, multiplexer unit 25 is controlled to permit data from the central processing unit to be read into memory when an appropriate signal appears on the control lines 201 and 203 from the control unit 41. Thus, when a high signal appears on line 201, the input from the central processing unit is passed through the multiplexer 25 to the memory circuitry generally designated by the numeral 207. The memory circuitry in the preferred embodiment is an active memory which consists of eight 4096 bit memory units wherein two memory units are coupled together to form the storage for a single bit of each four bit character stored. Thus memory units A and A' store one bit of a four bit character, memory units B and B' store a second bit of a four bit character and so on.

At the output of the memory unit, a memory buffer register of conventional design 31 is provided which receives four bit characters read out of the respective locations in the memory unit 207. The output of the memory buffer register is coupled to the display unit and the comparator 39 via lines generally designated by the numeral 153. In addition, the output of the memory buffer register is coupled to the input-output unit 21 via inverters generally designated by the numeral 209. At the same time that a data is read out of memory 207 to the display unit 13 and to the input-output unit 21, the same data is coupled to the temporary memory register 33 via lines designated by the numeral 211. Because data from memory is read directly into the temporary register 33, a memory buffer register is not needed to control the flow of the data thereto. A logic or decoding circuit generally designated by the numeral 213 is provided for generating an output signal on line 141 to the display unit 13 when the character "c" is read out of storage. This signal is also coupled to a flip-flop 215 which provides a lock output signal on line 217 upon the occurrence of a "c" character being read out of memory. The lock character "c" inhibits the recorder from going from the street address state to the meter identification number state. The flip-flop 215 is initially inputted with a high signal at its K input terminal which signal represents the last character in an eight character word. When the character "c" is read out of memory, a high signal appears at the J input of the flip-flop which term provides an output on line 217 for preventing the recorder from leaving the street address state. When the next word WD timing pulse occurs, the JK flip-flop 215 is cleared. When a reset signal appears on line 219, the flip-flop is also cleared. Ths signal on line 221 is the character clock signal for timing the JK flip-flop 215.

The input lines generally designated by the numeral 74 are derived from the timing circuit of FIG. 5 and are used for reading, writing and refreshing the active memory units A, A' through D, D'. In addition, on line 225 there appears a memory enable signal from a 12 volt clock driver (not shown). The timing circuit also provides select signals alternately on lines 227 and 229 for indicating which memory units A-D, or A'-D' are to be selected. These signals are derived from the outputs of gates 97 and 99, respectively. Finally, a signal is provided on line 231 for enabling data to be written into each of the memory units. To generate the signal on line 231 for causing a write command, either a UWRITE signal is provided at one input of NOR gate 233 from control unit 41 or a write signal is provided at the other input terminal of the NOR gate 233 which signal is derived at via inverter 235 from the central processing unit to which the input-output unit is connected. Thus, a writing operation in the memory can be controlled directly by the central processing unit via inverter 235 or in the alternative, the recorder can cause data recorded and temporarily stored in temporary register 33 to be written into memory by providing an appropriate signal on input line 232 to the NOR GATE 233.

Next, the provision of address locations within the storage will be explained. The address arrangement includes memory address registers which are conventional up-down counters 241, 241' and 241". In addition, temporary address multiplexers 243 and 243' are provided which, when appropriately controlled, couple the output of the memory address counters 241, 241' and 241" to the memory units 207 or couple a fixed temporary memory address location to the memory units 207. The multiplexers 243 and 243' are controlled by a STACK signal on line 245 from the control unit 41 which lets a fixed memory address at the inputs designated FN through the memory unit to temporarily store therein the meter input data keyed into the recorder when the recorder is in the input state. When the signal on line 245 goes in the opposite direction, the output of the memory address counters 241, 241' and 241" is passed through the multiplexers 243, 243' and NAND gate 247 to thereby address the memory 207. The factors which determine the presence of a high or low signal on line 245 will be explained more fully hereinbelow. However, it is only when input information is keyed into the keyboard representing the meter reading during the input state of the recorder that the fixed temporary memory adress location is addressed and this data read thereinto. After the comparison is made to determine whether the data is within predetermined upper and lower limits, the data may be cleared from the temporary register and new information inputted thereinto or the information may be stored in a location determined by the count of the memory address counters 241, 241', and 241" from the temporary register 33 through multiplexer circuits 193 and 25.

The memory address counters sequentially access or address locations in memory 207 as the recorder advances through each of its states in sequence and to each new customer location. At the onset, when the street location, meter identification, and upper and lower limit information is being read into the memory via the central processing unit, a reset signal from the computer appears on input line 251 which signal is inverted and coupled to the reset inputs of the counters 241 to thereby set the counters to the address of the beginning of memory. Subsequently, depending on whether the memory location to be addressed is the next succeeding, such as when the recorder goes from the street address to meter identification state, a low signal will appear at the UP input 253 from the control unit 41 which signal is inverted by the inverter 255 and coupled to the up-down inputs 257 of the counters 241. This signal causes the counters 241 to count in the up or forward direction. If, however, the recorder is not at the beginning of memory, a high signal can be coupled to input terminal 253 from the control unit which causes the counters 241 to count down. This occurs when it is desired to return the recorder from, for example, the meter state to the street address state or to return the recorder from the present customer to the previous customer by depressing the PCUST key. Advance of the counters 241 is controlled by an address increment signal which appears on line 259 from the control unit 41. This signal causes the counters 241, 241' and 241" to advance as a unit, that is, counter 241 is initially stepped through a series of counts until it reaches its upper limit; then counter 241' is advanced one unit. Counter 241 is again advanced to its upper limit and then counter 241' is again advanced to one unit, and thus in sequence the memory 207 is advanced through each of its memory locations as memory increment signals are coupled to input line 259. The timing of each of the counters is provided by a character clock input on line 271 from the timing circuit of FIG. 5.

An AND gate 273 is provided which detects the count at the output of the memory address counters 241. The output of AND gate 273 is coupled to NAND gate 275, which receives at its other input the next to the least significant digit at the output of the memory address counter 241. The output of NAND gate 275 is inverted and coupled to a pair of NAND gates 277 and 279. The other input to NAND gate 277 is derived from the output of the memory address counter 241 corresponding to the least significant digit. This output, when low, indicates that the counter is addressing the beginning of the memory. When the signal is high, it indicates that the counter is accessing or addressing a location other than at the beginning of memory. This signal is utilized to inhibit the PCUST key when the beginning of memory state is being accessed.

The least significant digit at the output of the memory address counter 241 is also inverted and coupled to NAND gate 279. The output of NAND gate 279 is inverted with the output thereof appearing on line 281. When this signal is high, it indicates that the end of memory has been reached. When the signal is low it indicates that a location in memory is being addressed which is other than at the end of memory. This signal is coupled to the keyboard circuit disclosed in FIG. 9 for inhibiting the NCUST and ENTER keys when the end of memory has been reached.

Refer now to FIG. 9 which is a schematic block diagram of the keyboard unit 29 of the present invention. The keyboard unit includes a keyboard switch matrix 301 of conventional design known in the art. It includes a series of switches, one each connected to the input lines 0–9, blank, CMT, PCUST, NCUST, CE, and ENTER. Signals periodically appear on each of these input lines from decoder circuits 303 and 303'. The inputs due to decoder circuits 303 and 303' are derived from lines generally designated by the numeral 71 which are the outputs of counter 65 illustrated in a timing circuitry of FIG. 5. The signals on line 71 provide a repeated count of 0–15 which counts are decoded by the decoder 303 and 303' to put each of the inputs to the keyboard matrix 301 in a sequential and periodic high state. When for example, one of the keys on the keyboard is depressed, a high signal is provided at the output 305 of the keyboard matrix 301 which signal is shaped by inverters 307 and 309 and coupled to a series of JK flip-flops 311, 312 and 313 which flip-flops provide output signals to NAND gate 315 for insuring that only one pulse is provided at the output of NAND gate per key depression or actuation. In addition, the output of the inverter 309 is coupled directly to the NAND gate 315. Also coupled to the NAND gate 315 is the blank output of decoder 303' which signal is inverted before being coupled to the input of the NAND gate 315. The output of the NAND gate 315 is coupled via NAND gate 317 to NAND gate 319. The output of NAND gate 319 is coupled to the clock input of the temporary register 33. The other input to NAND gate 319 is a character clock signal derived from the timing circuitry of FIG. 5.

In operation, for example, when the character 0 is entered into the recorder by depressing the 0 key, a signal appears at the output of the keyboard matrix 301 at the time a pulse appears at the 0 output of the decoder 303. This pulse signal is coupled to NAND gate 315, the output of which enables NAND gate 319 which permits data to be read into register 33 from multiplexer 35. As will be seen, multiplexer 35 is controlled upon depression of the 0 key to permit the count information on lines 71 to pass therethrough and be stored in the register 33. The output of register 33 is then coupled to a comparator 39, and to the multiplexer 193 in the memory unit 23.

Information can also be coupled to the temporary register 33 via multiplexer 35 from the memory 207 via lines 211 when an appropriate control signal is coupled to the control input of the multiplexer 35.

The output of the NAND gate 315 is also inverted by inverter 321 and coupled to the enabling input of AND gate 322 as well as to the enabling input of AND gate 323. The other input to AND gate 323 is a data out-of-memory signal on line 325 which is derived from the control unit 41. This signal is also coupled to the NAND gate 317 and then to the enabling input of NAND gate 319 when data is to be read out of memory on lines 211 and into the temporary memory register 33 via multiplexer 35. At the same time, this signal is coupled to the other input of AND gate 323 which provides a low output when data is to be read out of memory 207 and written into the temporary register 33. This low signal is coupled to control input 327 of the multiplexer 35 to cause the multiplexer 35 to pass signals on line 211 therethrough to the register 33. When, on the other hand, data is not to be read out of memory, the signal on line 325 is low and hence AND gate 323 will provide a high output when NAND gate 315 provides an output indicating that an appropriate key has been depressed. When this occurs, the high signal at the data control input 327 of multiplexer 35 causes the multiplexer to pass through signals on lines 71 to the temporary register 33.

A data available flip-flop 351 is provided which has an output which is coupled to the control unit 41 as will be seen hereinbelow to indicate that data is available as keyed into the recorder via the keyboard. The flip-flop 351 is initially cleared when the recorder is not in the input state or when data keyed into the recorder has been temporarily stored. The not in input state signal is derived from the control unit 41 and appears on line 353 and the character stored signal appears on line 355 which signal is also derived from the control unit 41 as will be seen hereinbelow. A clock signal from the timing circuit is provided on line 357 and a reset signal is coupled to the data available flip-flop when the comparison made by comparator 39 has been completed. This signal appears on input line 359. The data available flip-flop is set to provide a character available signal on output line 352 when a high signal appears at its J input. Such a high signal is derived when one of the keys of the keyboard has been depressed, and when the output of NAND gate 361 is high. The output of NAND gate 361 is high only when one of the two inputs thereto from the line 71 are low.

The keyboard unit also provides signals for stepping the recorder to the next state and for inhibiting the NCUST and PCUST key at the end of memory and beginning of memory, respectively. Thus, a decoder 371 is provided with inputs A and B to the decoder 371 indicating which of the buttons PCUST, NCUST, CE and ENTER have been depressed. Another signal from the output of inverter 373 is coupled to the C input of decoder 371 which inhibits the output thereof when a key on the keyboard matrix 301 has not been depressed. Finally, the output of NAND gate 361 is coupled to the D input of the decoder to enable same. An output which is high is provided at the Q3 output of the decoder 371 when the clear, i.e., CE key has been depressed. This signal is coupled to the control unit to permit erasing of the input data in the temporary fixed memory location when in the input state and to permit return to this state when in the compare state, and to the street address state when in the meter number state. The Q1 output is coupled to one input of a previous customer inhibit NAND gate 375, the output of which when high prevents the recorder from stepping back to the previous customer. Other inputs to the NAND gate 375 include a street address state signal at input 377 which signal is derived from the control unit and is high when the system is in the street address state. In addition, a not beginning of memory signal is provided at input terminal 381 which signal is high when the memory address is not at the beginning location of memory. Thus, it can be seen that unless the recorder is in the street address state, the PCUST button has been depressed and the memory address is not at the beginning of memory, the NAND gate 375 will not provide a signal for causing the memory to count down or count backwards to the previous customer address.

The Q2 output of the decoder 371 is coupled to a new customer inhibiting NAND gate 391, which signal is high when the NCUST key has been depressed. In addition, a not at end of memory signal appears on line 382, which signal is high when the memory location being addressed is not at the end of memory. Finally, a signal on input line 377 is provided to the NAND gate 191 which is high when the recorder is in the street address state. The output of the NAND gate 391 is low when a next customer can be accessed by depressing NCUST key. Thus, it can be seen that a next customer cannot be accessed in the recorder unless the recorder is in the street address state, the NCUST key has been depressed and the memory location being addressed is not at the end of the memory.

Finally, the Q4 output is provided when the ENTER key is depressed. This signal is coupled to a NAND gate 397. Also coupled to the input of NAND gate 397 is a not end of memory signal derived from line 382 which signal is high when the memory location in address is not at the end of memory. Finally, the output of NAND gate 399 is coupled to the remaining input of NAND gate 397. NAND gate 399 provides a high output at all times except when both the inputs thereto are high. Thus, when the recorder is in the street address state and as derived on line 217, a signal indicating that a street address display has already been entered, that is, a lock signal appears, the NAND gate 397 is inhibited. The output of the NAND gate 397 is inverted by inverter 400 with the output thereof being coupled to the control unit for permitting the entering into memory of data inputted and to cause stepping from the respective states to the next succeeding states of the recorder. It can be seen that enter is inhibited if the memory location being addressed is at the end of memory if the enter button is not depressed and if the system is in the street address state and the lock signal is high indicating that the street address displayed on display 13 has already been entered.

The comparison function performed by comparator 39 will now be described. As aforementioned, the purpose for the comparison process is to indicate to the meter reader by the flashing commas on the display 13 that the meter reading keyed into the recorder is greater than or less than a predetermined range of meter readings.

Initially the comparator 39 compares the meter reading coupled thereto from the output of register 33 with the output of the memory buffer register 31 which corresponds to the upper or lower limit anticipated for the meter being read. This anticipated limit depends on a previous history of meter readings together with a safety factor. The comparator provides an output at terminal L when the meter reading for a four bit character read into the recorder is less than the predetermined lower limit for that four-bit character. The comparator provides an output at the E terminal when the 4 bits of the characters are equal to one another and provides an output on the G terminal if the 4 bits read into the recorder are greater than the lower limit character coupled to the comparator 39. At the outset, the four most significant characters of each eight character word, i.e., number, are coupled to the comparator 39 in sequence and initially the upper limit is tested. Thus, assume for example that the first character read from the temporary register 33 is less than the first character of the upper limit number. A high signal is coupled to the input of NAND gate 403. At the same time, a low signal is coupled to the NAND gate 405 from the G output of the comparator 39 and a low output at terminal E is inverted and coupled to each of the AND gates 407 and 409. Refer now briefly to FIG. 11 where there is disclosed the circuitry for controlling the comparison. A counter circuit 411 is provided having a count advance input on line 413, which count advance signal occurs each time the four bits of a character are read out of memory and into the comparator 39. Accordingly, the counter 411 advances one count each time four bits, that is, a character, is read out of memory into the comparator. Initially, a test is made to determine whether the reading is greater than the upper limit anticipated for the meter reading. Accordingly, for the first four characters read into the comparator, the output of the NOR gate 415 is high. The reason for this is that NAND gate 417 does not provide a low output until the output lines Q0 and Q2 go high. When this occurs, the output of the NAND gate 417 goes low, which signal is inverted by NAND gate 418. The output of NAND gate 418 is coupled to NOR gate 415, the output of which on line 416 goes low. At the same time, the other output of the NOR gate 415 on line 414, that is the non-inverting output of the NOR gate 415, remains low. The signal on line 416 is coupled to AND gate 419 of FIG. 9. The other input to AND gate 419 is derived from the control circuitry of control 441 illustrated in FIG. 2, which signal is high when the recorder is in the compare state.

Accordingly, before the fifth character is read into the comparator 39, the output of AND gate 419 is high. This signal is coupled to NAND gate 405 and at the same time is coupled to one input of AND gate 407. The output of AND gate 407 is coupled to JK flip-flop 421, the Q output of which is coupled to NAND gate 403 to inhibit this gate when a comparison is being made with respect to an upper limit value and the output of the E terminal of the comparator is low.

Assume, for example, that one of the first four characters tested is less than the upper limit of the corresponding character in the upper limit word or number. When this occurs a low output at the E terminal of the comparator is provided which output is inverted and coupled to the respective inputs of AND gates 407 and 409. At the same time, a high input is coupled to AND gate 407 to thereby provide a high signal to the J input of the flip-flop 421. At the same time a low signal appears at the input of AND gate 427 via line 414 with a resulting low signal being coupled to one input of AND gate 409. Accordingly, a low input is coupled to the K input of the JK flip-flop 421. When this occurs a high output is provided at the Q terminal of flip-flop 421, which output is coupled to NAND gate 403 for enabling this gate while a low output at the $\bar{Q}$ output is coupled to the NAND gate 405 for disabling this NAND gate. It accordingly can be seen that any further comparisons will have no affect since the NAND gate 405 is inhibited and will remain inhibited until the outputs of the JK flip-flop 421 are reset when the comparator is switched over from comparing the input data with an upper limit to comparing the input data with a lower limit.

On the other hand, assume for example that a comparison is being made against the upper limits and a first comparison indicates that the input character is greater than the upper limits character which it corresponds to. When this occurs, a high signal is provided to one input of the NAND gate 405. At the same time, since the number of characters compared has not reached 5, the output of AND gate 419 is high which output is coupled to NAND gate 405. Finally, this high output of AND gate 419 is coupled to AND gate 407 causing the Q output of flip-flop 421 to be coupled to the input of NAND gate 405 so that the output of NAND gate 405 is low. This low signal is inverted and coupled to the J input of JK flip-flop 435. The K input of the JK flip-flop 435 is low when the comparison state occurs. Accordingly, a low output appears at the $\bar{Q}$ output which signal is coupled to the control unit 41 as will be explained more fully hereinbelow to generate a flashing signal to the display circuitry 27 illustrated in FIG. 6.

Should the input data be less than the upper limit for the particular meter being read after four characters of the data number have been compared, the signal on line 416 will go low thereby inhibiting the NAND gate 405. After the input word has been compared against the upper limit word, a high signal is provided on line 414 from the circuitry illustrated in FIG. 11. This signal causes the JK flip-flop 421 to switch output states to thereby enable NAND gate 403 and continue to inhibit NAND gate 405. If one of the characters is less than the corresponding character in the lower limit number, NAND gate 403 will provide a low output which is inverted and coupled to the J input of JK flip-flop 435. The JK flip-flop in response provides a low output at its $\bar{Q}$, which signal will be coupled to the control circuit for energizing the flashing commas on the display 13.

Figure 10A:
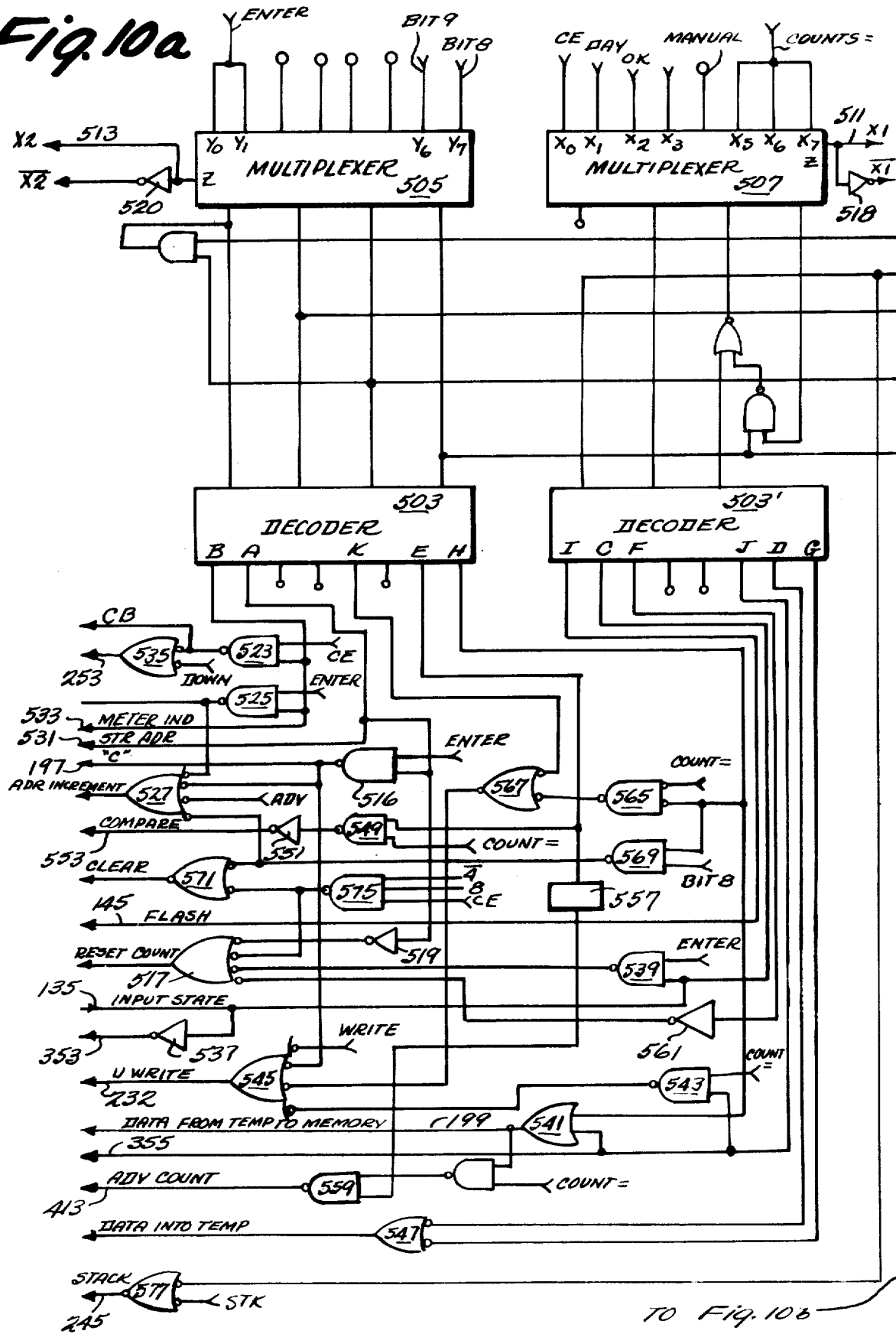
FIGS. 10a and 10b is a schematic block diagram of the control circuitry for sequencing the recorder of the preferred embodiment of the present invention.
Figure 10B:
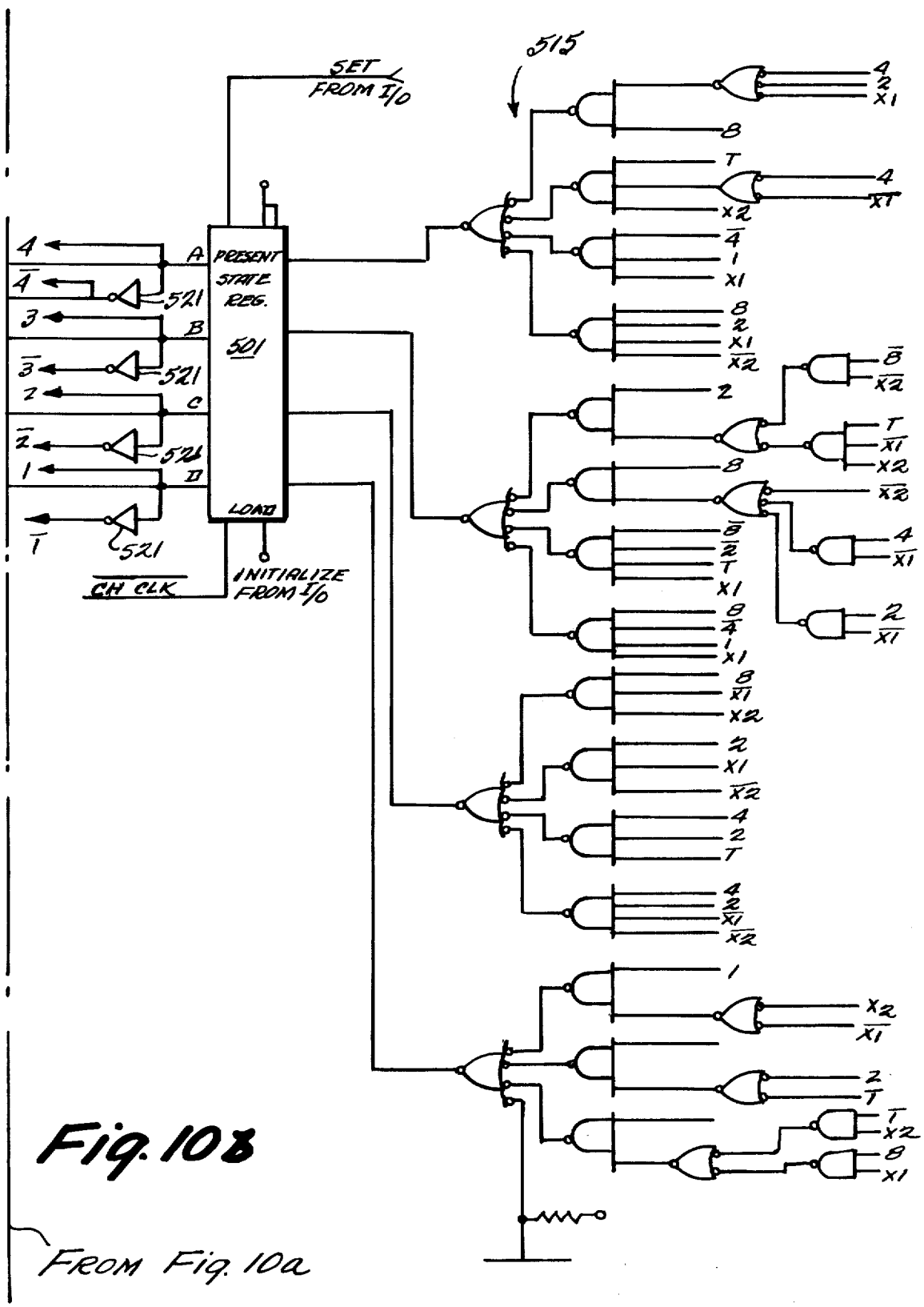

Refer now to FIGS. 10A and 10B which are schematic illustrations of the control circuitry 41 of the present invention. The control circuit must generate internal signals representing not only the major states such as street address and input, but also minor or secondary states through which the recorder steps depending upon what keys are depressed, and whether a comparison has passed or failed, among others. Depending on the present state of the recorder, commands are given by the control circuitry of FIG. 10B for controlling, inter alia, the memory, the keyboard, the comparator and the display.

In FIG. 10B there is illustrated a present state encoder or register 501 for determining the present state of the recorder. The register 501 is set by a signal from the central processing unit via the input/output unit so that the output at terminals A-D indicates that the recorder system is initially in the street address state. In the present embodiment, the street address state is indicated by the following signals at terminals A through D, respectively: 0,0,0,1. Other states are represented by the outputs of the register 501 as set out in the table on page 67. Also coupled to the present state register 501 is a clock signal from the timing circuit and an initialization signal at the load terminal from the central processing unit. The output signals at terminals A-D are coupled to a pair of decoder circuits 503 and 503'. In addition, these signals are coupled to multiplexer circuits 505 and 507. The other inputs to the multiplexer circuits 505 and 507 include an ENTER signal at terminals $Y_0$ and $Y_1$ which signal is derived from the output of the inverter 400 in the keyboard unit illustrated in FIG. 9. A bit-nine signal is coupled to input terminal $Y_6$ which signal is derived from the comparator control circuit illustrated in FIG. 11 which indicates that the counter has counted to nine when making a comparison against the upper and lower limit, thereby indicating that the comparison is finished and the recorder is ready to go on to the next state. A bit eight signal is coupled to the $Y_7$ terminal which signal is used to count eight characters during the upper-lower comparison, eight characters keyed in from the keyboard, or eight characters transferred into memory. With respect to multiplexer 507, the input at terminal $X_0$ is the clear signal derived from the output of decoder unit 371 which forms a part of a keyboard unit illustrated in FIG. 9. In addition, a data available or character available signal is coupled to terminal $X_1$ which signal is derived from the output of the JK flip-flop 351 in the keyboard unit and which signal indicates that another character is available in the temporary register 33. The input at $X_2$ is the OK signal derived from the output of the comparator which signal indicates that the comparison is OK and the recorder is ready to write the input data into memory and advance to the next state. The input at terminal $X_3$ is a manual switch which allows data to be written into the recorder memory via the keyboard in lieu of having data read thereinto from the central processing unit. Finally, at terminals $X_5$-$X_7$, the count equal signal from the output of comparator 502, illustrated in FIG. 11, is applied. The count equal signal indicates that four characters of data have been read into the comparator from both the register 33 and the memory unit 207 and accordingly, a comparison is completed.

The outputs of the multiplexers 505 and 507 at terminals 511 and 513 are fed back to a logic circuitry generally designated by the numeral 515 in FIG. 10B. The logic circuitry 515 determines the next state function, that is the output of this logic circuitry is coupled to the present state register 501 to advance the register either to the next state, the previous state, or to maintain the register in its present state. The inputs to the logic circuit 515, which in effect is a next function generator, include the outputs of the multiplexers 505 and 507 directly or as inverted by inverters 518 and 520 and include the designated outputs of the present state register 501, either as inverted by inverters 521 or as coupled directly thereto.

Referring now more specifically to FIG. 10A, the street address state output of decoder 503 appears at the terminal A. This signal is high when the recorder is in the street address state. The street address signal is coupled directly to a street address output terminal 531 which is connected to input terminal 123 of the display unit illustrated in FIG. 6 to cause a comma in the second digit location to be energized, thereby indicating that the meter is in the street address state.

The output of terminal A is also coupled to a NAND gate 516 with the other input thereto being derived from the ENTER output of the keyboard circuit 29 illustrated in FIG. 9. Thus, this signal is high when the ENTER key is depressed and the recorder system is not in a lock condition when in the street address state. The output of NAND gate 516 is coupled to input 197 of the memory unit which, when the output is low, enables the character "c" into memory. This causes the street address to be locked and forces the system to advance to the meter identification state unless, of course, the clear key is depressed instead of the enter key, in which case the memory returns to the present street address and the character "c" is deleted from memory. The output of NAND gate 516 also comes an input to OR gate 527, whose output advances the memory address to the meter identification. The output of terminal A indicating the street address state is also coupled to a reset count OR gate 517 via inverter 519. The output of gate 517 is a reset count signal which is coupled to the compare control circuitry of FIG. 11 to reset the counter 411 at input terminal 521 thereof.

When the state of the recorder moves to the meter identification or meter number state, a high output appears at the B terminal of the decoder 503. The output of terminal B is coupled directly to the output terminal 533, which terminal is coupled to the input terminal 129 of AND gate 131 in the display unit 27 to energize the comma in the third digit position. In addition, the output of the B terminal is also coupled to one input of NAND gate 523 and NAND gate 525. The output of NAND gate 525 is coupled to one input of NAND gate 527. The other input to NAND gate 525 is an ENTER signal which goes high when the ENTER key has been depressed and the recorder is not in a lock condition in the A state. The output of OR gate 527 is coupled to input terminal 259 of the memory unit to advance the memory count one step when the output of OR gate 527 goes high.

The other input to NAND gate 523 is derived from the clear output of the keyboard unit 29 which is high when the clear button is depressed. The output CB of NAND gate 523 is coupled to the circuitry of FIG. 13, which will be explained more fully hereinbelow, which circuit provides an ADV output to OR gate 527 for causing the memory address counter to count in either the up or down direction. In order to control the direction in which counting is to take place, the output of NAND gate 523 is coupled to NAND gate 535, the output of which is coupled to input line 253 of the memory circuit for causing the memory adjust counter to count down one location. The other input DOWN to NAND gate 535 is derived from the memory control circuit of FIG. 13 which provides an input to NAND gate 535 when the previous customer key PCUST is depressed, thus causing the memory address counter to count down to the previous customer.

The next output in the sequential operation of the recorder is derived from terminal C of decoder 503'. This signal is coupled directly to output line 135 which is connected to the display unit 27. A high signal on this line causes the energization of the comma character 1 in the fourth digit position to indicate that the recorder is in the input state. This signal is also coupled to the reset input of JK flip-flop 421 and to the K input of JK flip-flop 435 of the comparator circuit of FIG. 9, thus, setting the comparison circuit for comparing the input versus the upper and lower limits stored in memory. In addition, the output of the C terminal is inverted by inverter 537 and coupled to input terminal 353 of the data available flip-flop 351 in the keyboard unit. This signal in effect clears the JK flip-flop during all states except the input state, thereby inhibiting the keyboard entry of data except when in the input state. The output of terminal C is also coupled to a NAND gate 539, the other input of which is an ENTER signal derived from the keyboard unit 29. The output of NAND gate 539, which is low when the ENTER button has been depressed and the recorder is in the input state, is coupled to the NAND gate 517, the output of which maintains the reset on the counter 411 of the comparator control circuit of FIG. 11.

Next an output occurs at the J terminal of the decoder 503'. The output of this terminal is coupled directly to the data available flip-flop 351 via line 355 to clear the data available flip-flop. In addition, the output of the J terminal is coupled to NOR gate 541, the output of which is coupled via line 199 to the data-in multiplexer 193 in the memory unit for causing data to be read out of the temporary register 33 and into the memory. The output of the J terminal is also coupled to one input of a NAND gate 543, the other input of which is derived from the count equal output of the comp rator 502 of FIG. 11. The output of NAND gate 543 is coupled to one input of NAND gate 545. The output of the NAND gate 545 is coupled to the NOR gate 233 in the memory unit via line 232 to cause the input data coupled to the memory unit via multiplexers 193 and 25 to be written into memory.

In the continuing sequence of the operation of the recorder, the next output is derived from output terminal D of decoder 503' which output is coupled to one input of NAND gate 547. The output of NAND gate 547 is high when data is to be read out of memory and into the temporary register 33 via switch multiplexer 35. Thus, whenever a high signal appears at the output terminal D, data is read from temporary storage into the register 33 to thereby initiate a comparison in the comparator circuitry of FIG. 9.

The next output is at terminal E of decoder 503. This signal is coupled to one input of NAND gate 549, the output of which is inverted by inverter 551. The other input to NAND gate 549 is a count equal signal derived from the output of the comparator 502 of FIG. 11 for controlling the comparator circuit. Thus, when the count equal sign is high and an output appears at terminal E, a high output signal is generated at the output of inverter 551, which signal is a compare command coupled to AND gates 419 and 427 of the comparator circuitry via line 553. Thus, when an output appears at the E terminal of decoder 503, a compare command is given when the count equal signal is high, which signal indicates that a complete character has been written into the comparator 39. The output of the E terminal is also delayed by delay circuit 557 and coupled to OR gate 559. The output of OR gate 559 is an advance count signal to indicate that a character has been read out of storage and into the comparator 39. The output of OR gate 559 is coupled to the counter 411 of FIG. 11.

Sequentially, the next output is of the F terminal of decoder 503' which signal is inverted by inverter 561 and connected to OR gate 517 to cause the count of counter 411 to be reset. Next, if a comparison did occur, that is, the input to terminal $X_2$ of multiplexer 507 is low, a high signal will appear at the I output of the decoder 503'. This signal is coupled to line 145 which, when high, causes each of the comma characters of the display unit to be energized on a flashing basis to thereby indicate to the meter reader that the comparison has failed. If at this point the reader decides to depress the CLEAR key, the recorder is returned to the input state so that a high signal again appears at the C terminal of the decoder 503'. Otherwise, the no comparison signal can be overwritten by entering the data keyed into the recorder by depressing the ENTER button. When this occurs a high signal will appear at the output terminal G of the decoder 503'. In addition, if the comparison had registered OK, a high signal would appear at the $X_2$ input of multiplexer 507 in which case the output of the G terminal would have gone high. The output of the G terminal is coupled to NAND gate 547 which initiates the storage of the data read into the recorder by causing the characters stored in the memory location in which the new character is to be stored to be read thereout and into the temporary register 33 via multiplexer 35. Next, an output appears at the H terminal, which output is coupled to OR gate 541. The output of OR gate 541 causes the information in the temporary register 33 to be stored in memory via the multiplexer 193 and 25. At the same time, the output of the H terminal is coupled to NAND gate 565. The other input to NAND gate 565 is a count equal signal indicating that the character in the temporary register 33 may be written into memory. The output of NAND gate 565 is coupled to a NOR gate 567, the output of which is coupled to NAND gate 545. The output of NAND gate 545 on line 232, as aforementioned, is coupled to the memory circuit for causing the characters stored in a temporary register to be written into the appropriate memory location.

At the same time the output of the H terminal is also coupled to the NAND gate 569, the other input of which is a bit eight signal which goes high when eight characters have been stored in memory. The output of NAND gate 569 is coupled to a NAND gate 571, the output of which is coupled to the memory circuit via the circuit of FIG. 13 for causing the temporary memory location to be set to all blanks. The temporary location can also be set to all blanks by depressing the clear key CE which is one of the inputs to NAND gate 575. This gate is inhibited, however, whenever a low signal appears at output terminal A of present state register 501 and a high signal appears at output terminal B of the present state register 501. Thus, when a low signal appears at the output terminal A and a high signal appears at the output terminal B of register 501, these signals inhibit the NAND gate 575, thereby rendering a depression of the CLEAR key incapable of clearing the temporary memory.

Finally, when a high signal appears at output terminal K, the signal is coupled to NOR gate 567, the output of which is coupled to NAND gate 545 to cause the memory unit to write the characters stored in the temporary register 33. The high signal at the K terminal only occurs after the clear key CE has been depressed when in the meter identification state, i.e., state B. It causes the recorder to be returned to the meter address location state, i.e., state A and also causes a blank character to be written over the "c" in $X_8$. When a low signal appears at the output terminal A of the present state register 501, this signal is inverted and coupled to NAND gate 577. The output of NAND gate 577 when high causes the fixed address to address a temporary fixed location in the memory unit 207, but when the output of NAND gate 577 is low, the multiplexers 243 are appropriately switched to let the memory address counter location pass through to address the appropriate location in memory.

Figure 12:
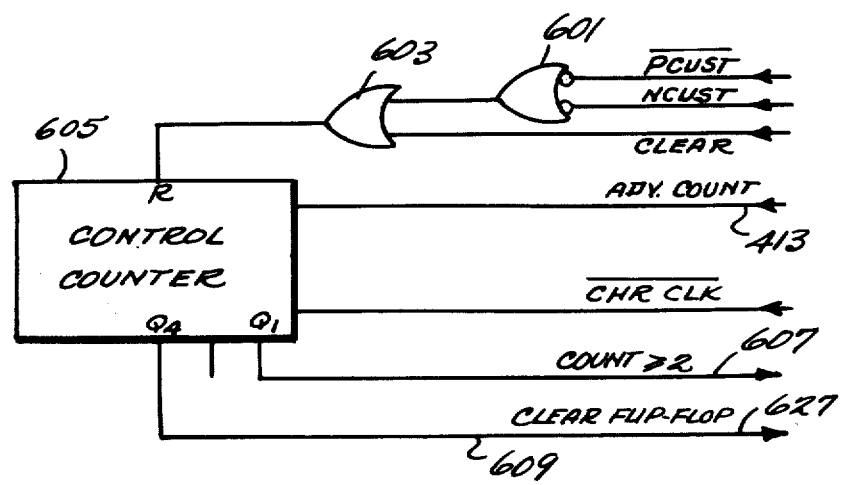
FIG. 12 is a schematic block diagram of circuitry for controlling the advance of the recorder to the next customer or retreat to the previous customer.

Refer now to FIG. 12 which is a portion of the control circuitry 41 for controlling the advance of the memory unit. When the new customer key NCUST or the previous customer key PCUST is depressed, under the conditions set out hereinabove in connection with the discussion of the keyboard circuitry 29, low signals are coupled to the input terminals of a NAND gate 601. The output of this gate is coupled to OR gate 603, the output of which is coupled to the reset terminal of a control counter 605. The other input to OR gate 603 is derived from the CLEAR temporary storage output of the control circuit of FIG. 10A. Thus, the previous customer/new customer control counter 605 is reset whenever a command is given to CLEAR the temporary storage location in memory, when a previous customer key has been validly actuated or when a next customer key has been validly actuated. The counter 605 is advanced each Character Clock time if the Adv Count signal 413 is high. This signal is a result of either the NCUST 613, PCUST 617 or Clear 627 flip-flops being set. In the first two cases, NCUST or PCUST, the memory address register 241 is incremented or decremented, respectively, each character clock time. When two pulses have occurred, the signal Count Equal or Greater than Two 607 goes high, which is used to clear the NCUST and PCUST flip-flops, and the incrementing or decrementing operation ends, the memory address having been advanced to the next customer, or decremented to the previous customer street address. In the third case the Clear flip-flop 627 is set to clear the temporary memory location. One character is cleared each character clock time and the counter 605 is advanced each character clock time. When the counter advances to eight, the Clear Flip-Flop signal 627 is given to clear the Clear flip-flop 627, ending the operation.

Refer now to FIG. 13 which shows the control circuitry for advancing the memory unit. When the NCUST key has been validly depressed under the conditions set out hereinabove, a low signal appears at the input of inverter 611 from the keyboard circuit of FIG. 9. The output of inverter 611 is coupled to the J input of JK flip-flop 613. The input to the K terminal of JK flip-flop 613 is the output on line 607 of the counter of FIG. 12, which signal appears after the counter has been incremented two times. When the NCUST key is depressed, a low signal appears at the Q output of the JK flip-flop 613 which signal is coupled to NAND gate 615, the output of which is inverted and coupled to the input of NAND gate 527 of FIG. 10A and the ADV input thereof. As aforementioned, the output of NAND gate 527 causes the memory address counter to count one step. In addition, the $\bar{Q}$ output of the JK flip-flop 613 is coupled to a multiplexer circuit 243 of the memory unit to cause the output of the memory address counters 241 to address the memory location when the NCUST key is depressed. Finally, the $\bar{Q}$ output of flip-flop 613 is coupled to 619, the output of which is coupled to the ADV count input of control counter 605 of FIG. 12 to advance the memory through three word locations so that the next customer address is generated by memory address counters 241.

When a previous customer is to be called out of memory when in the street address state, the PCUST key is depressed causing a high signal to appear at the J input of flip-flop 617. When this occurs, a low output appears at the $\bar{Q}$ output of this flip-flop which signal is inverted by NAND gate 615 and coupled to the ADV input of NAND gate 527 of FIG. 10A to thereby cause the memory address counter to count one step. In addition, in order to control the direction of count, the $\bar{Q}$ output of flip-flop 617 is coupled to the DOWN input of NAND gate 535 of FIG. 10A. The output of this gate is coupled to the memory address counters 241 via line 253. Thus, when a low signal appears at the Q output of JK flip-flop 617, the memory address counters are caused to count down thereby causing the memory address counter to address the previous street address location. Since the count equal to or greater than two signal does not appear at the K input of the JK flip-flop 617 until three memory address locations have been counted, it can be seen that the memory address counter steps through the data and meter identification memory locations of the previous customer to the street address location thereof so that the street address location of the previous customer is displayed on the display unit.

The $\bar{Q}$ output of flip-flop 617 is also coupled to NAND gate 619, the output of which advances the control counter 605 of FIG. 11 so that the memory address counters count backward to the proper location.

Also coupled to the NAND gate 615 is a signal from the output of NAND gate 523 of FIG. 10A which is low when the recorder is in the meter identification number state and the CE key is depressed. This low signal is inverted by NAND gate 615 and coupled to the advance input of gate 527 to cause the memory address counter to count one step. Thus, the meter addresses the previous location in memory which is the street address state. Another input to the NAND gate 615 is derived from the output of NAND gate 625. The output of NAND gate 625 is low, which signal is required for advancing the memory address counter when a high signal appears on the I/O line from the computer. This signal is high when data is being transferred to or from the central processing unit and the memory of the present invention. The memory address counter, however, must go to the next count only on the clock transition which occurs during the last character of an eight character word to thereby cause the WD input to the NAND gate 625 to go high. Accordingly, whenever more data is to be read into the recorder from the central processing unit and the end of an eight character word is signified, the memory address counter is advanced one location to initiate the writing of another eight character word into memory.

Flip-flop 627 has a clear input coupled to the J input terminal from the output of NAND gate 571 of FIG. 10A, which signal causes the Q output of flip-flop 627 to go high. This signal is coupled to NOR gate 629, the output of which is coupled to OR gate 545 of FIG. 10A. The output of NAND gate 545 provides a command signal on line 232 to cause the information to be written into memory. At the same time, the $\bar{Q}$ output goes low which signal enables the counter 605 to be advanced. A signal occurs at the $\bar{Q}$ output each time a four bit character has been written into memory. After eight such characters have been written into memory, the output on line 609 from the counter 605 of FIG. 12 provides a signal at the K input of JK flip-flop 627, which signal resets the flip-flop. Each time the $\bar{Q}$ output of flip-flop 627 provides a low going output signal, this signal is inverted by NAND gate 577 of the control circuit of FIG. 10A which signal is coupled to the multiplexer circuits 243 of the memory unit for causing the fixed temporary memory address of the memory circuit to be addressed so that each four bit character is read thereinto.

On the following page is a state table wherein in the first column the respective outputs A-K of the decoders 503 and 503' are listed, which outputs represent a more detailed listing of the sequential states of the recorder than those illustrated in FIG. 3. The next column represents the respective outputs of the present state register 501 for causing the outputs A-K of the decoders 503 and 503' to go high. The third column represents possible inputs to the multiplexers 505 and 507 during the time that the recorder is in the respective states A-K as represented by high outputs at the output terminals A-K of decoders 503 and 503'. Finally, the last column is a list of next outputs of the decoders 503 and 503' if the outputs of multiplexers 505 and 507 are as indicated. Thus, if the register is in state A and if the $X_1$ output of multiplexer 505 is 0, and the $X_2$ output of multiplexer 507 is 1, then the present register will generate 0,0,0,0 at its respective outputs which, in turn, causes output B of decoder 503 to go high.

STATE TABLE

| Output High at Decoders 503 & 503' | Output of Present State Register 501 A B C D | Inputs to Multiplexers 505 507 | | Next Output at Decoders 503 & 503' If Output of Mlpxs 505 & 507 is | |
|---|---|---|---|---|---|
| | | | | $X_1$ | $X_2$ |
| A | 0 0 0 1 | MANUAL | ENTER | 0 | A | 0 |
| | | | | 0 | B | 1 |
| | | | | 1 | C | 0 |
| | | | | 1 | C | 1 |
| B | 0 0 0 0 | CE | ENTER | 0 | B | 0 |
| | | | | 0 | C | 1 |
| | | | | 1 | K | 0 |
| | | | | 1 | — | 1 |
| C | 1 0 0 1 | DAV | ENTER | 0 | C | 0 |
| | | | | 0 | D | 1 |
| | | | | 1 | J | 0 |
| | | | | 1 | — | 1 |
| D | 1 1 1 0 | COUNT = | — | 0 | D | 0 |
| | | | | 0 | — | 1 |
| | | | | 1 | E | 0 |
| | | | | 1 | — | 1 |
| E | 0 1 1 0 | COUNT = BIT 9 | | 0 | E | 0 |
| | | | | 0 | E | 1 |
| | | | | 1 | D | 0 |
| | | | | 1 | F | 1 |
| F | 1 0 1 0 | OK | — | 0 | I | 0 |
| | | | | 0 | — | 1 |
| | | | | 1 | G | 0 |
| | | | | 1 | — | 1 |
| G | 1 1 1 1 | COUNT = | — | 0 | G | 0 |
| | | | | 0 | — | 1 |
| | | | | 1 | H | 0 |
| | | | | 1 | — | 1 |
| H | 0 1 1 1 | COUNT = BIT 8 | | 0 | H | 0 |
| | | | | 0 | A | 1 |
| | | | | 1 | G | 0 |
| | | | | 1 | A | 1 |
| I | 1 0 0 0 | CE | ENTER | 0 | I | 0 |
| | | | | 0 | G | 1 |
| | | | | 1 | C | 0 |
| | | | | 1 | — | 1 |
| J | 1 1 0 1 | COUNT = | — | 0 | J | 0 |
| | | | | 0 | — | 1 |
| | | | | 1 | C | 0 |
| | | | | 1 | — | 1 |
| K | 0 1 0 0 | — | — | 0 | A | 0 |
| | | | | 0 | — | 1 |
| | | | | 1 | — | 0 |

STATE TABLE-continued

| Output High at Decoders 503 & 503' | Output of Present State Register 501 A B C D | Inputs to Multiplexers 505 507 | | Next Output at Decoders 503 & 503' If Output of Mlpxs 505 & 507 is | |
|---|---|---|---|---|---|
| | | | | $X_1$ | $X_2$ |
| | | | | 1 | — | 1 |

Refer now to FIG. 14 which shows a circuit for controlling the input-output unit 21 of the recorder of the present invention. When reading the stored contents in the recorder memory into the central processing unit, it is necessary to synchronize the reading process to the internal timing of the recorder of the present invention. This can be achieved by a handshaking process wherein an acknowledge signal is generated by the computer which indicates that the computer has acknowledged that the recorder is ready to read a new character into the computer. This signal is coupled to the flip-flop 651 via line 653. The flip-flop is set once each character clock. Thus, the flip-flop 651 is set and then reset to define a character clock interval for reading a character out of memory and writing same into the central processing unit. When the flip-flop 651 is set, a signal appears at the Q output thereof which signal is inverted and coupled to the central processing unit. The inverted signal is a flag signal FLG which is used to indicate that a write operation is complete or that a new character is available to be read. The flag signal is never reset by the recorder itself but rather can only be reset by an acknowledged signal AKN from the computer on input line 653. A second flip-flop 655 is provided to which an I/O signal is coupled from the computer. When this signal is low, an indication is made that data is enabled from the computer to the recorder. When, however, the signal is high, data is not enabled from the computer to the recorder. If the flag signal is not cleared by a subsequent acknowledge signal within a character clock time duration, the flip-flop 655 provides an output at its Q output which is inverted and coupled to the computer to indicate that data is late. When the data late signal goes high, an indication is made to the computer that the previous character was not read by the computer. The data late signal can only be cleared by giving a reset signal to the flip-flop 655 which causes the eight characters of the currently addressed word to be presented repeatedly on the data output line 210 of the memory unit. Thus, it can be seen that the input-output unit operates so that each time a flag signal goes high, a new character is available for reading. The input/output signal is then given continuously so that data is continuously read into the computer from the recorder. If a pause in the reading is desired, the input/output signal can be removed at the end of any eight character word. The currently addressed eight character word will then continue to be outputted until the input-output signal is again applied.

When writing data from the computer into the recorder, everytime the flag signal goes high, an indication is given to the computer that the character has been written and new data may be entered into the recorder. Thereafter, the write signal can be given to cause the data to be written into the memory of the recorder. If a pause in writing is desired, both the write and the I/O signals should be removed at the end of each eight character word. To again start writing, clear the flag signal by giving an acknowledged signal from the computer and initiate writing into the memory of the recorder.

It can be seen from the aforementioned detailed description of the preferred embodiment of the present invention that an improved utility meter recorder has been provided which is quite flexible and capable of being utilized to continually record data on various routes and to accurately and efficiently input the recorded data into a central processing unit for storage and other utilization purposes. While the present invention has been disclosed in connection with a preferred embodiment thereof, it should be understood that there may be other obvious variants of the present invention which fall within the spirit and scope of the appended claims.

What is claimed is:

1. A portable electronic recording apparatus for recording the data displayed on each of a plurality of designated utility meters, wherein said meters are positioned at a plurality of different locations and each of said meters has a unique identification number, the recording apparatus comprising:
   a solid state memory means for storing meter location, meter identification and meter data therein;
   first means for writing into selected locations of said memory, in sequence, the meter location information of each of a plurality of meters and the meter identification of each of said plurality of meters;
   a temporary memory for temporarily storing said meter data as said meter data is keyed into said recording apparatus;
   a keyboard means for introducing said meter data for each of said meters into said temporary memory;
   comparator means for comparing said temporarily stored meter data with at least one preselected limit;
   second means for writing said meter data into an addressed meter data storage location in said solid state memory means if said meter data is within said at least one predetermined limit;
   selective means in said keyboard means for erasing the meter data in said temporary memory location if said meter data is outside said at least one preselected limit;
   a display means for visually displaying in sequence for each meter the meter location, the meter identification and the meter data keyed into said memory means;
   means for addressing said memory means to couple the information in the addressed memory location to said display means; and
   means for advancing said addressing means after said meter location information is displayed to the memory location of at least one meter identification number corresponding to said location, said addressing means being responsive to said advancing means to address a meter data storage location after said meter identification number has been displayed, said addressing means being responsive to said advancing means to address the next meter location after said meter data has been stored in said addressed memory location.

2. The recording apparatus of claim 1 further comprising means for displaying a comparison failed signal on said display means when said meter data is outside said preselected limit.

3. The recording apparatus of claim 2 further comprising means for selectively addressing the memory location containing the meter location information of a previous or a next meter.

4. The recording apparatus of claim 3 further comprising means including said display means for visually indicating when said recorder is displaying meter location, meter identification or meter data information.

5. The recording apparatus of claim 1 further comprising selective means in said keyboard means for writing said meter data into said meter data memory location.

6. The apparatus of claim 5 wherein said display means comprises means for indicating when said meter data is outside said preselected limit.

7. The apparatus of claim 6 wherein said keyboard means comprises means for selectively advancing said memory address means to a previous meter location address or to a next meter address location.

8. The apparatus of claim 7 further comprising means for storing meter condition information in said meter data memory location.

9. In a portable electronic recording apparatus a method of recording the data displayed on each of a plurality of designated utility meters wherein said meters are positioned at a plurality of different locations and each of said meters has a unique identification number, the method comprising the steps of:
   writing into selected locations of a solid state memory, in sequence, the meter location information of each of a plurality of meters and the meter identification of each of said plurality of meters,
   introducing said meter data of each of said meters into said memory by a keyboard,
   temporarily storing said meter data as said data is keyed into said recording apparatus,
   comparing said meter data with at least one preselected limit,
   writing said meter data into a meter data storage location when said meter data is within said at least one preselected limit,
   selectively erasing the meter data temporarily stored if said meter data is outside said at least one preselected limit,
   visually displaying in sequence for each meter the meter location, the meter identification and the meter data keyed into said memory means,
   addressing said memory means to couple the information in the addressed memory location to said display means,
   advancing said addressing means after said meter location information is displayed to the memory location of at least one meter identification number corresponding to said location,
   advancing said addressing means to a meter data storage location after said meter identification number has been displayed, and
   advancing said addressing means to the next meter location storage location after said meter data has been stored in said memory address location.

10. The method of claim 9 further comprising the step of
   selectively addressing the memory location containing the meter location information of a previous or a next meter.

11. The method of claim 10 further comprising the step of selectively clearing said temporary memory location of said meter data if said meter data falls outside said at least one preselected limit.

12. The method of claim 11 further comprising the step of visually indicating whether said meter location, meter identification or said meter data information is being displayed.

13. The method of claim 9 further comprising the steps of selectively writing said meter data into said meter data memory location when said meter data is outside one preselected limit.

14. The method of claim 13 further comprising the step of indicating when said meter data is outside said preselected limit.

15. The method of claim 14 further comprising the step of selectively advancing said memory address means to a previous meter location address or to a next meter address location.

16. The method of claim 15 further comprising the step of storing meter condition information in said meter data memory location.

* * * * *

REEXAMINATION CERTIFICATE (1253rd)

United States Patent [19]
Reed et al.

[11] B1 4,169,290
[45] Certificate Issued Apr. 17, 1990

[54] DATA RECORDING METHOD AND APPARATUS

[75] Inventors: Alan C. Reed, Salt Lake City; John H. Sherwood, Bountiful, both of Utah

[73] Assignee: Utility Devices, Inc., Salt Lake City, Utah

Reexamination Request:
No. 90/000,432, Aug. 8, 1983

Reexamination Certificate for:
Patent No.: 4,169,290
Issued: Sep. 25, 1979
Appl. No.: 872,648
Filed: Jan. 26, 1978

Related U.S. Application Data

[63] Continuation of Ser. No. 755,846, Dec. 30, 1976, abandoned, which is a continuation of Ser. No. 592,057, Jun. 30, 1975, abandoned.

[51] Int. Cl.$^4$ ............................................. G06F 3/14
[52] U.S. Cl. ................................................... 364/900
[58] Field of Search .................. 364/200, 900, 401; 346/14 MR; 179/2 AM; 360/4

[56] References Cited

U.S. PATENT DOCUMENTS

3,942,157  3/1976  Azure .............................. 340/172.5
3,998,093  12/1976  Bertolasi .............................. 73/112

OTHER PUBLICATIONS

Sippl, Charles J., *Computer Dictionary*, First Edition, Fourth Printing, Howard W. Sams and Co., Inc., The Bobbs-Merrill Co., Inc., Indianapolis, (1970), p. 43.
Automatic Data-Processing Systems, Principles & Procedures; 2nd Edition,-Gregory et al, Wadsworth Publ. Co., Inc., 1963, pp. 522, 523, 526, 527, 529, 538.
Computer, Pub. of IEEE Computer Society; Nov.–Dec. 1971; pp. 17–25.
The Integrated Circuits Catalog for Design Engineers, 1st edition, Texas Instr. Inc.; 1972; pp. 9–289.
Computer; Feb. 1975, p. 64.
Computer; Jul., 1974, p. 65.
Computer; Nov. 1973, p. 39.
Proceedings National Conference of Electric and Gas Utility Accountants, Apr. 29, 1968, pp. C 53–C 62.
American Gas Journal, Apr. 1964, article entitled "LILCO Automates its Meter Reading".
UGC Instruments Metercorder Magnetic Digital Recorder, UGC Instruments, Jun. 10, 1963, pp. 1–20.
Metercorder Manual, 1964.

*Primary Examiner*—Felix D. Gruber

[57] ABSTRACT

A method and apparatus for recording utility meter readings is disclosed. The apparatus includes a solid state memory and an input/output unit which, among other things, causes meter location and identification information to be written into memory, and data representing the respective meter readings to be read out of the memory unit into a central processing unit. A keyboard is utilized to introduce meter readings into the memory and to control the addressing of the memory as each of a plurality of meters is located, identified and the data displayed thereon entered into memory. A visual display unit displays the location of the meter to be read, the meter identification and the meter reading entered via the keyboard. A comparator circuit within the recorder compares the meter reading with expected predetermined maximum and minimum limits for the meter reading and generates an indicator signal to the display when the meter reading does not fall within the predetermined bounds. The meter is portable, is powered by batteries and is programmable to provide the location and identification of a plurality of meters as desired.

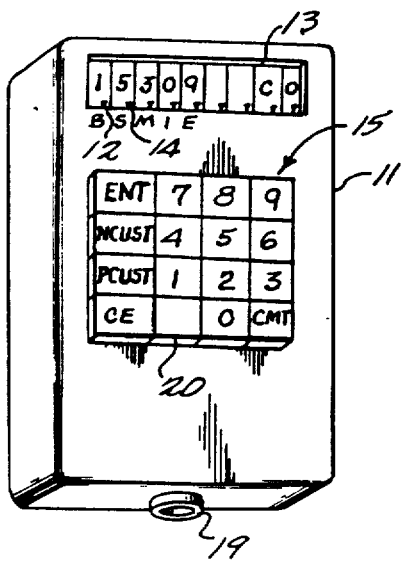

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–16 are cancelled.

* * * * *